(12) United States Patent
Klaba et al.

(10) Patent No.: US 11,744,034 B2
(45) Date of Patent: Aug. 29, 2023

(54) RACK ADAPTING DEVICE FOR AN ELECTRONIC EQUIPMENT RACK AND ADAPTIVE RACK SYSTEM HAVING SAME

(71) Applicant: OVH, Roubaix (FR)

(72) Inventors: Henryk Klaba, Roubaix (FR); Jules Hermann Bonenfant, Lys lez Lannoy (FR); Valentin Cartigny, Mons-en-Barœul (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/827,266

(22) Filed: May 27, 2022

(65) Prior Publication Data
US 2022/0386500 A1    Dec. 1, 2022

(30) Foreign Application Priority Data

May 27, 2021    (EP) ..................................... 21305707

(51) Int. Cl.
*H05K 7/14*    (2006.01)
*H05K 7/18*    (2006.01)

(52) U.S. Cl.
CPC ........... *H05K 7/1489* (2013.01); *H05K 7/183* (2013.01)

(58) Field of Classification Search
CPC ....................................................... H05K 7/00
See application file for complete search history.

(56) References Cited

U.S. PATENT DOCUMENTS

| 6,574,100 | B1  | 6/2003  | Anderson |
| 8,773,861 | B2* | 7/2014  | Ross ................... H05K 7/1487 |
|           |     |         | 361/725 |
| 8,801,122 | B2  | 8/2014  | Chapel et al. |
| 8,922,987 | B2  | 12/2014 | Lin |

(Continued)

FOREIGN PATENT DOCUMENTS

| CN | 109982540 A    | 7/2019 |
| DE | 202012103372 U1 | 10/2012 |
| EP | 1462913 A2     | 9/2004 |

OTHER PUBLICATIONS

Extended European Search Report with regard to the counterpart EP Patent Application No. 21305707.8 completed Nov. 23, 2021.

(Continued)

*Primary Examiner* — Jerry Wu
(74) *Attorney, Agent, or Firm* — BCF LLP

(57) ABSTRACT

A rack adapting device for an electronic equipment rack is disclosed. The electronic equipment rack is configured to house first electronic equipment modules having a first module width between left and right equipment supports laterally spaced apart from one another by a rack housing width corresponding to the first module width. The rack adapting device is configured to adapt the electronic equipment rack to house a plurality of second electronic equipment modules having a second module width and comprises: an adapter body; a plurality of rack-engaging features disposed on a first lateral side thereof and configured to engage rack mounting features of one of the left and right equipment supports; and a plurality of adapter mounting features disposed on a second lateral side such that, in use, the second electronic equipment modules are mounted between the rack adapting device and an other one of the left and right equipment supports.

20 Claims, 16 Drawing Sheets

(56) References Cited

U.S. PATENT DOCUMENTS

| | | | |
|---|---|---|---|
| 9,232,678 B2 * | 1/2016 | Bailey | H05K 7/1492 |
| 9,943,003 B2 | 4/2018 | Segroves et al. | |
| 10,314,394 B2 | 6/2019 | Chen et al. | |
| 10,827,652 B2 | 11/2020 | Gupta et al. | |
| 2002/0046979 A1 | 4/2002 | Larsen et al. | |
| 2004/0201335 A1 | 10/2004 | Davis | |
| 2015/0331459 A1 | 11/2015 | Ross et al. | |
| 2017/0280580 A1 | 9/2017 | Nguyen et al. | |

OTHER PUBLICATIONS

English Abstract for CN109982540 retrieved on Espacenet on May 24, 2022.

"Mobile Telephony Power Supply", Cabinets—Outdoor ServicePLUS, 4most, https://www.4most.co.uk/index.php?route=product/product/download&pdf=1&document_id=920 accessed on May 24, 2022, pdf 1 page.

English Abstract for DE202012103372 retrieved on Espacenet on May 24, 2022.

"Data communication and industrial enclosures", ZPAS, Data communication and industrial enclosures [EN012], pp. 44-45.

* cited by examiner

RACK ADAPTING DEVICE FOR AN ELECTRONIC EQUIPMENT RACK AND ADAPTIVE RACK SYSTEM HAVING SAME

CROSS-REFERENCE

The present application claims priority from European Patent Application No. 21305707.8, filed May 27, 2021, the entirety of which is incorporated by reference herein.

FIELD OF TECHNOLOGY

The present technology relates to electronic equipment racks, such as server racks, and rack adapting devices therefor.

BACKGROUND

Certain racks are designed for optimally housing electronic equipment such as servers and other related supporting equipment. For example, such electronic equipment racks, which may also be referred to as server racks, are widely used in datacenters. Notably, a server rack is designed to accommodate multiple server modules positioned above one another, where each server module includes one or more servers. In particular, the rack is dimensioned such that an internal width of a housing section thereof corresponds to the standardized width of the server modules. A number of mounting features is also defined by the rack in order to mount the server modules to the rack and are spaced in accordance with appropriate standards. For example, such standards may be set by Electronic Industries Association guidelines (e.g., EIA-310) for racks that are designed to accommodate server modules having a standardized width of 19 inches (approximately 482.6 mm).

However, server modules are also designed according to different standards, including for example 21-inch wide server modules that are compliant with Open Compute Project (OCP) guidelines. As such, a datacenter may include server racks that are designed to accommodate respective ones of the types of server modules, for instance one type of server rack designed to accommodate 21-inch wide server modules and another type of server rack designed to accommodate 19-inch wide server modules. Different solutions are available to address this issue, however they typically require individual adjustment of each server module and can therefore be time consuming and require a significant amount of mechanical adjustments that may be prone to instability and maladjustment. In addition, these solutions can be expensive to implement as they may require a significant amount of additional components.

There is therefore a desire for an adaptive rack system which can alleviate at least some of these drawbacks.

SUMMARY

It is an object of the present technology to ameliorate at least some of the inconveniences present in the prior art.

According to one aspect of the present technology, there is provided a rack adapting device for an electronic equipment rack. The electronic equipment rack is configured to house a plurality of first electronic equipment modules having a first module width, the electronic equipment rack comprising left and right equipment supports laterally spaced apart from one another by a rack housing width corresponding to the first module width. Each of the left and right equipment supports comprises a plurality of rack mounting features for mounting the first electronic equipment modules between the left and right equipment supports. The rack mounting features are first apertures defined by the left and right equipment supports. The rack adapting device is configured to adapt the electronic equipment rack to house a plurality of second electronic equipment modules having a second module width, the second module width being less than the first module width. The rack adapting device comprises an adapter body having a width dimensioned such that, when the rack adapting device is connected to the electronic equipment rack, the electronic equipment rack defines an adapted housing width corresponding to the second module width. The rack adapting device comprises a plurality of rack-engaging features connected to the adapter body and disposed on a first lateral side thereof, the rack-engaging features being configured to engage the first apertures of one of the left and right equipment supports of the electronic equipment rack to connect the rack adapting device to the one of the left and right equipment supports. The rack adapting device comprises a plurality of adapter mounting features disposed on a second lateral side of the adapter body, the adapter mounting features being configured for mounting the second electronic equipment modules to the rack adapting device such that, in use, the second electronic equipment modules are mounted between the rack adapting device and an other one of the left and right equipment supports of the electronic equipment rack. The adapter mounting features are second apertures defined by the adapter body, the second apertures having a same shape as the first apertures.

In some embodiments of the rack adapting device, the rack-engaging features are connector legs extending from the adapter body and configured to be inserted into the apertures of the one of the left and right equipment supports.

In some embodiments of the rack adapting device, the connector legs are shaped to be inserted into the corresponding first apertures and slid along the first apertures in a depth direction of the electronic equipment rack to hook onto the one of the left and right equipment supports.

In some embodiments, each second aperture comprises: an enlarged portion having a first height; a reduced portion having a second height, the second height being less than the first height; and a transition portion extending between the enlarged and reduced portions, a height of the transition portion decreasing along a span thereof from the enlarged portion to the reduced portion.

In some embodiments, the second apertures are distributed in a plurality of columns that are spaced from each other in a depth direction of the electronic equipment rack.

In some embodiments, the plurality of columns is a plurality of a second aperture columns; the first apertures are distributed in a plurality of first aperture columns; and a position of the second aperture columns along the depth direction of the electronic equipment rack corresponds to the first aperture columns.

In some embodiments of the rack adapting device, the adapter body comprises a locking portion configured to abut a portion of the electronic equipment rack, the locking portion being configured to be removably fastened to the electronic equipment rack.

In some embodiments of the rack adapting device, the adapter body comprises a plurality of laterally-extending portions vertically spaced apart from one another, the rack-engaging features being connected to the laterally-extending portions. The adapter body comprises a vertically-extending portion connected to the laterally-extending portions, the vertically extending portion comprising the adapter mounting features.

In some embodiments of the rack adapting device, the adapter body is a first adapter body configured to be connected, via the rack-engaging features, to the one of the left and right equipment supports and the adapter mounting features are first adapter mounting features. The rack adapting device further comprises a second adapter body configured to be connected to the other one of the left and right equipment supports of the electronic equipment rack; and a plurality of second adapter mounting features provided on the second adapter body and configured for mounting the second electronic equipment modules to the rack adapting device such that, in use, the second electronic equipment modules are mounted between the first and second adapter mounting features of the first and second adapter bodies.

According to a second aspect of the present technology, there is provided an adaptive rack system comprising an electronic equipment rack configured to house a plurality of first electronic equipment modules having a first module width, the electronic equipment rack comprising a frame and a left equipment support and a right equipment support connected to the frame, the left and right equipment supports being laterally spaced apart from one another by a rack housing width corresponding to the first module width, each of the left and right equipment supports comprising a plurality of first apertures for mounting the first electronic equipment modules between the left and right equipment supports. The adaptive rack system comprises the rack adapting device, the rack-engaging features being insertable being engageable with the first apertures of one of the left and right equipment supports to connect the adapter body thereto in order to adapt the electronic equipment rack to house a plurality of second electronic equipment modules having a second module width, the second module width being less than the first module width.

In some embodiments, the first apertures include a plurality of first type of first apertures and a plurality of second type of second apertures; the first type of first apertures have a different shape than the second type of second apertures; and the second apertures have the same shape as the first type of first apertures.

In some embodiments, the first type of first apertures are arranged in a plurality of first columns; and the second type of first apertures are arranged in a plurality of second columns offset, in a depth direction of the electronic equipment rack, from the first columns.

In some embodiments of the adaptive rack system, the adapter body is a first adapter body configured to be connected, via the rack-engaging features, to the one of the left and right equipment support and the adapter mounting features are first adapter mounting features. The rack adapting device comprises a second adapter body configured to be connected to the other one of the left and right equipment supports of the electronic equipment rack; and a plurality of second adapter mounting features provided on the second adapter body for mounting the second electronic equipment modules to the rack adapting device such that, in use, the second electronic equipment modules are mounted between the first and second adapter mounting features of the first and second adapter bodies.

In some embodiments of the adaptive rack system, a height of the adapter body is less than a height of the one of the left and right equipment supports.

In some embodiments of the adaptive rack system, the rack adapting device is a first rack adapting device; and the adaptive server rack system further comprises a second rack adapting device configured to adapt the electronic equipment rack to house a plurality of third electronic equipment modules having a third module width, the third module width being less than the second module width. The second rack adapting device comprises an adapter body having a width dimensioned such that, when the second rack adapting device is connected to the electronic equipment rack, the electronic equipment rack defines an other adapted housing width corresponding to the third module width; a plurality of rack-engaging features connected to the adapter body and disposed on a first lateral side thereof, the rack-engaging features being configured to engage the first apertures of one of the left and right equipment supports of the electronic equipment rack to connect the second rack adapting device to the one of the left and right equipment supports; and a plurality of adapter mounting features disposed on a second lateral side of the adapter body, the adapter mounting features being configured for mounting the second electronic equipment modules to the second rack adapting device such that, in use, the second electronic equipment modules are mounted between the second rack adapting device and an other one of the left and right equipment supports of the electronic equipment rack.

In some embodiments of the adaptive rack system, the first module width is 21 inches and the second module width is 19 inches.

In some embodiments of the adaptive rack system, the electronic equipment rack is a server rack.

According to another aspect of the present technology, there is provided an adaptive rack system comprising: an electronic equipment rack configured to house a plurality of first electronic equipment modules having a first module width, the electronic equipment rack comprising: a frame; a left equipment support and a right equipment support connected to the frame, the left and right equipment supports being laterally spaced apart from one another by a rack housing width corresponding to the first module width, each of the left and right equipment supports comprising a plurality of apertures for mounting the first electronic equipment modules between the left and right equipment supports, the apertures including a plurality of first type of apertures and a plurality of second type of apertures, the first type of apertures having a different shape than the second type of apertures; and a rack adapting device configured to adapt the electronic equipment rack to house a plurality of second electronic equipment modules having a second module width, the second module width being less than the first module width, the rack adapting device comprising: an adapter body having a width dimensioned such that, when the rack adapting device is connected to the electronic equipment rack, the electronic equipment rack defines an adapted housing width corresponding to the second module width; a plurality of rack-engaging features connected to the adapter body and disposed on a first lateral side thereof, the rack-engaging features being configured to engage the apertures of one of the left and right equipment supports of the electronic equipment rack to connect the rack adapting device to the one of the left and right equipment supports; and a plurality of adapter mounting features disposed on a second lateral side of the adapter body, the adapter mounting features being configured for mounting the second electronic equipment modules to the rack adapting device such that, in use, the second electronic equipment modules are mounted between the rack adapting device and an other one of the left and right equipment supports of the electronic equipment rack.

In some embodiments, the adapter mounting features are second apertures defined by the adapter body; and the second apertures have a same shape as the first type of apertures.

In some embodiments, the first type of apertures are arranged in a plurality of first columns; and the second type of apertures are arranged in a plurality of second columns offset, in a depth direction of the electronic equipment rack, from the first columns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

In the present description, various terms relating to spatial orientation such as "front", "rear", "top", "bottom", "left", "right", "upward", "downward", etc. will be used to provide a clear description of the present technology. However, it is understood that these terms are merely used to improve the clarity of the description and in no way are meant to be limiting in regard to orientation.

Figure 1:
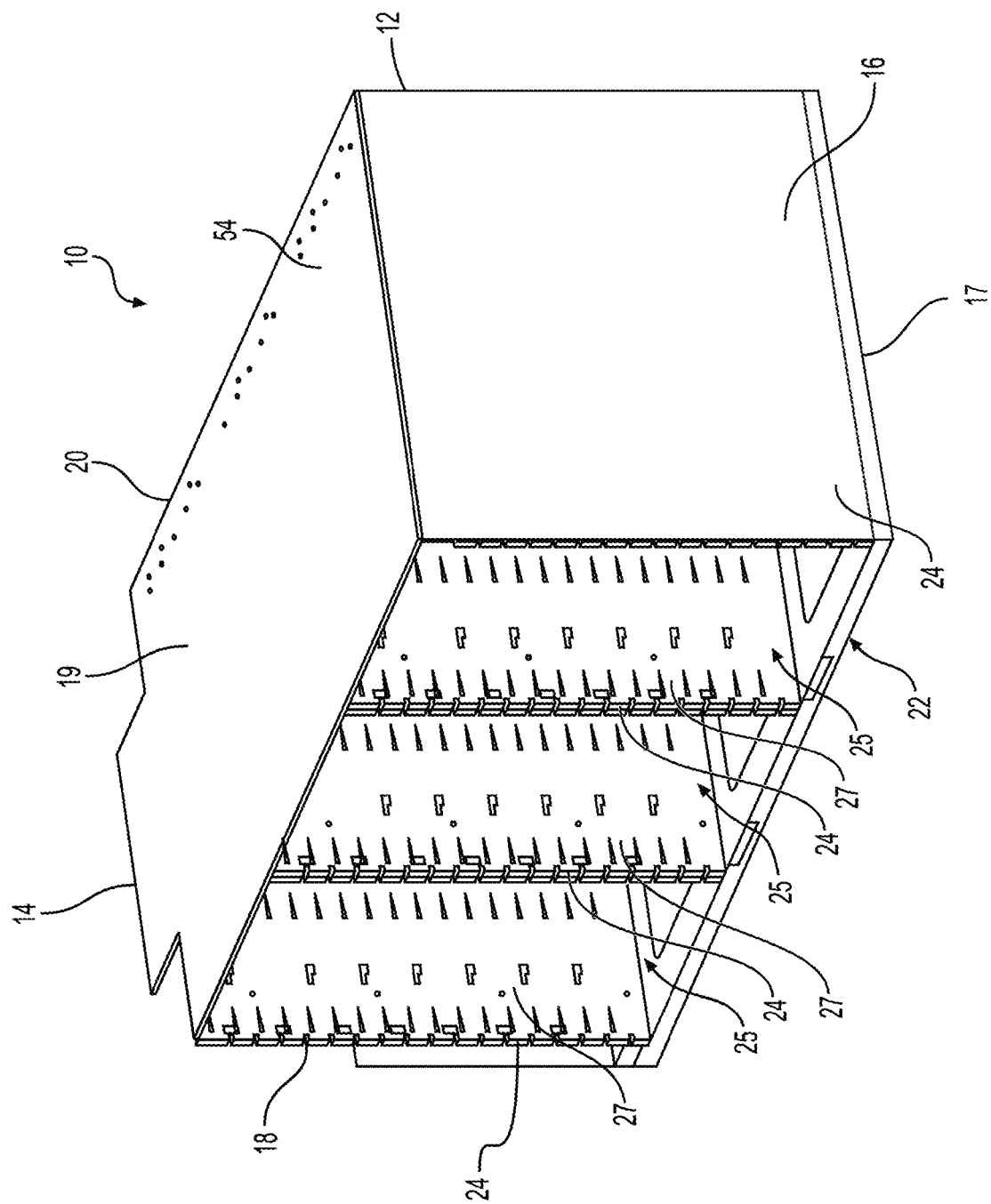
FIG. 1 is a perspective view, taken from a top, front, right side, of an electronic equipment rack.
Figure 2:
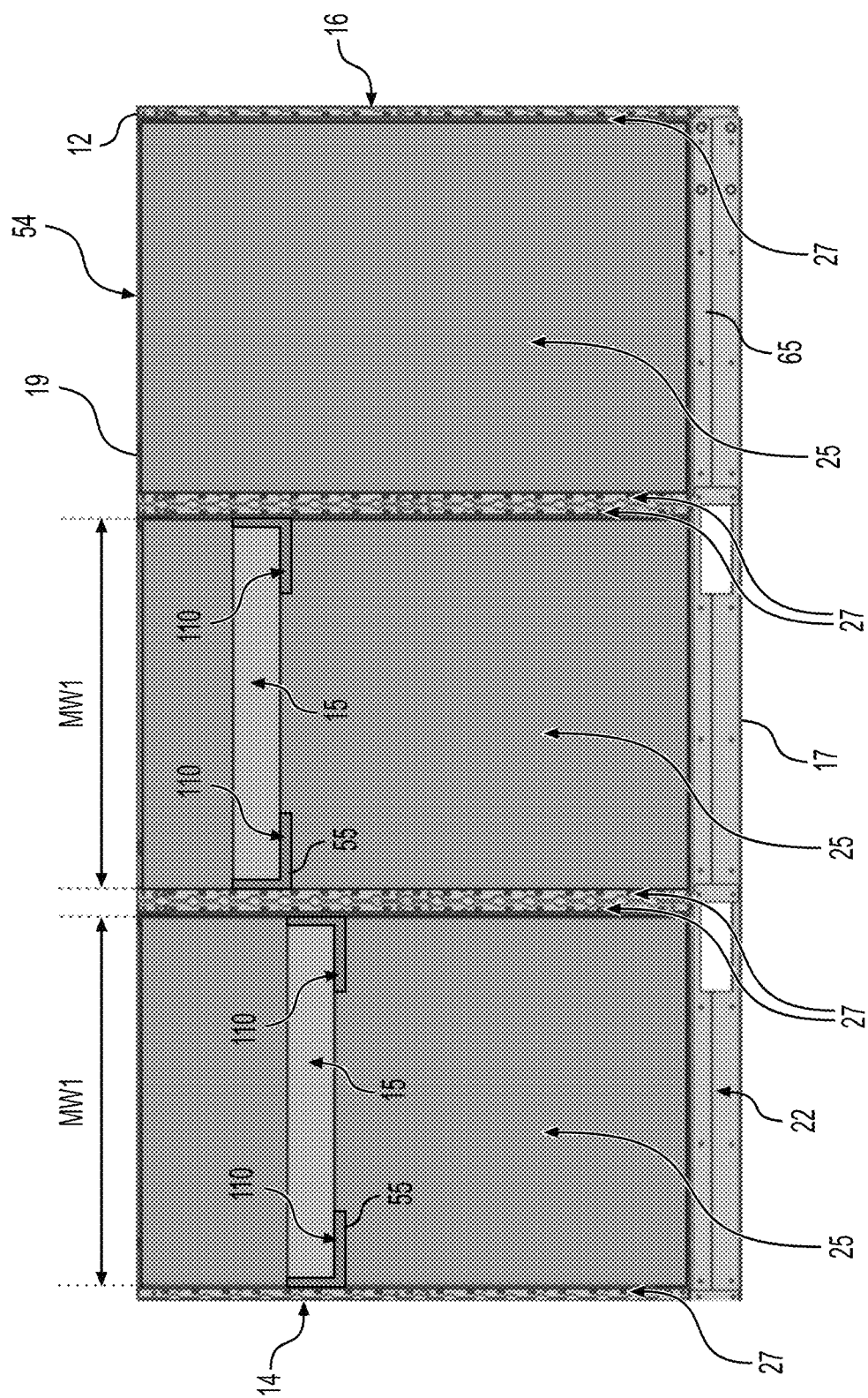
FIG. 2 is a front elevation view of the electronic equipment rack of FIG. 1, shown with an exemplary electronic equipment module housed therein.

FIGS. 1 and 2 show an electronic equipment rack 10 configured to support electronic equipment therein, including for example computer systems such as servers, as well as related supporting equipment (e.g., heat exchangers for heat dissipation of the computer systems). In some implementations, the rack 10 may be used in a data center. In such a case, the rack 10 could be supported by a rack-supporting frame (not shown) provided to align a plurality of racks 10 in a row, notably to help manage heat within the data center. As shown in FIG. 2, the rack 10 is configured to house a plurality of electronic equipment modules 15. Each electronic equipment module 15 includes a support unit 55 and electronic equipment such as a server or other electronic equipment (e.g., networking equipment) supported by the support unit 55. As will be described in detail below, the support unit 55 provides connecting means for connecting the electronic equipment module 15 to the rack 10. The electronic equipment modules 15 have a standardized first module width, or "module width", MW1 and the rack 10 is designed to accommodate the first module width MW1 of the electronic equipment modules 15. For example, in this embodiment, the first module width MW1 is approximately 542 mm (approximately 21 inches).

In this embodiment, the electronic equipment rack 10 is a server rack and the electronic equipment modules 15 housed thereby are server modules or related functional modules (e.g., networking or power supply modules).

As will be described in detail further below, the present technology provides a rack adapting device that can be used to adapt the rack 10 to accommodate electronic equipment modules having widths that are smaller than the first module width MW1. This can provide a user with greater versatility in the use of the rack 10 and provide a cost-effective manner in which other electronic equipment modules can be housed by the rack 10.

With reference to FIGS. 1 and 2, the rack 10 has a left lateral end 14 and a right lateral end 16 which are opposite one another in the lateral direction. A front end 18 is disposed on a front side of the rack 10 and a rear end 20 on a rear side of the rack 10. As can be seen, in this embodiment, the rack 10 has a width, measured between the lateral ends 14, 16, that is less than a height thereof, measured between a lower end 17 and an upper end 19 of the rack 10. As such, the rack 10 can be said to be horizontally-extending rather than vertically-extending. It is contemplated that the rack 10 could be vertically-extending in other embodiments.

A frame 12 of the rack 10 has a base 22 defining a bottom portion of the rack 10. The base 22 has a front wall 65 on the front side of the rack 10 and a rear wall on the rear side of the rack 10. In this embodiment, the frame 12 has a plurality vertical walls 24 fastened to the base 22 and extending upwardly therefrom. An upper frame member 54 extends parallel to the base 22 and defines at least in part the upper end 19 of the rack 10. Notably, the upper frame member 54 is a generally planar sheet metal component that is fastened to the upper ends of the vertical walls 24.

The vertical walls 24 are laterally spaced from one another so as to define housing sections 25 therebetween in which the electronic equipment modules 15 can be housed. In this embodiment, the frame 12 includes four vertical walls 24 which define three housing sections 25 between consecutive ones of the vertical walls 24. The rack 10 may define a different number of housing sections 25 in alternative embodiments (e.g., a single housing section in some embodiments). Equipment supports 27 are connected to each vertical wall 24 and extend parallel thereto. In this embodiment, the equipment supports 27 are generally rectangular vertical mounting panels and thus the equipment supports 27 will be referred to hereinafter as "mounting panels" 27. As will be described in greater detail below, each mounting panel 27 defines a plurality of mounts onto which the support units of the electronic equipment modules 15 can be mounted. As such, in use, each of the housing sections 25 houses a plurality of the electronic equipment modules 15, each housing section 25 being defined between left and right equipment supports 27 laterally spaced apart from one another by a rack housing width that is suitable for connection of the electronic equipment modules 15. Notably, the rack housing width corresponds to the standardized first module width MW1 of the electronic equipment modules 15. It is to be understood that the rack housing width "corresponding" to the first module width MW1 does not mean that the rack housing width is exactly the same as the first module width MW1, but rather that the rack housing width and the first module width MW1 are dimensioned such that the electronic equipment modules 15 closely fit within the rack housing width to allow connection of the electronic equipment modules 15 to the left and right equipment supports 27.

Figure 3:
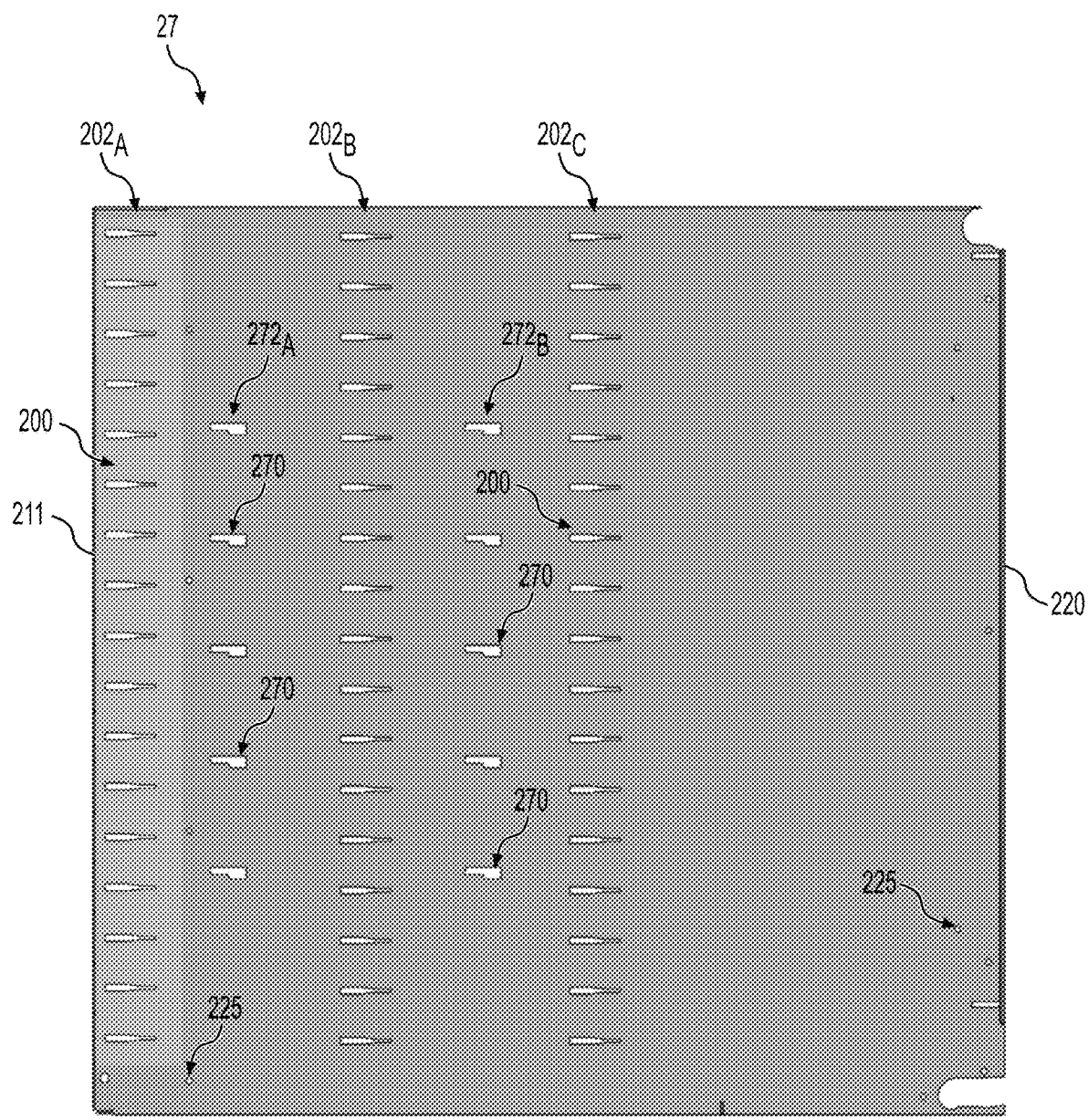
FIG. 3 is a right side elevation view of a left mounting panel of the electronic equipment rack of FIG. 1.

FIG. 3 illustrates one of the mounting panels 27, namely a left mounting panel 27 defining a left side of one of the housing sections 25. The mounting panel 27 extends in a depth direction of the rack 10 from a front end 211 to a rear end 220. Right mounting panels 27 defining the right sides of the housing sections 25 are a mirror image of the left mounting panel 27 of FIG. 3. Therefore, only one the left mounting panels 27 will be described in detail herein. It is to be understood that the same description applies to the right mounting panels 27.

As shown in FIG. 3, the mounting panel 27 has a plurality of first rack mounting features 200 for mounting the support units 55 of the electronic equipment modules 15 to the rack 10. In this embodiment, the rack mounting features 200 are apertures defined by the mounting panel 27. The apertures 200 are distributed in three distinct columns $202_A$, $202_B$, $202_C$ of rack mounting features 200 that are spaced from one another in the depth direction of the rack 10. Each rack mounting feature 200 of the front column $202_A$ is vertically aligned with a corresponding rack mounting feature 200 of the middle column $202_B$ and with a corresponding rack mounting feature 200 of the rear column $202_C$, thereby defining sets of three rack mounting features 200 aligned in a same row. The mounting panel 27 may comprise additional rows and/or columns of rack mounting features 200 in other embodiments.

Figure 4:
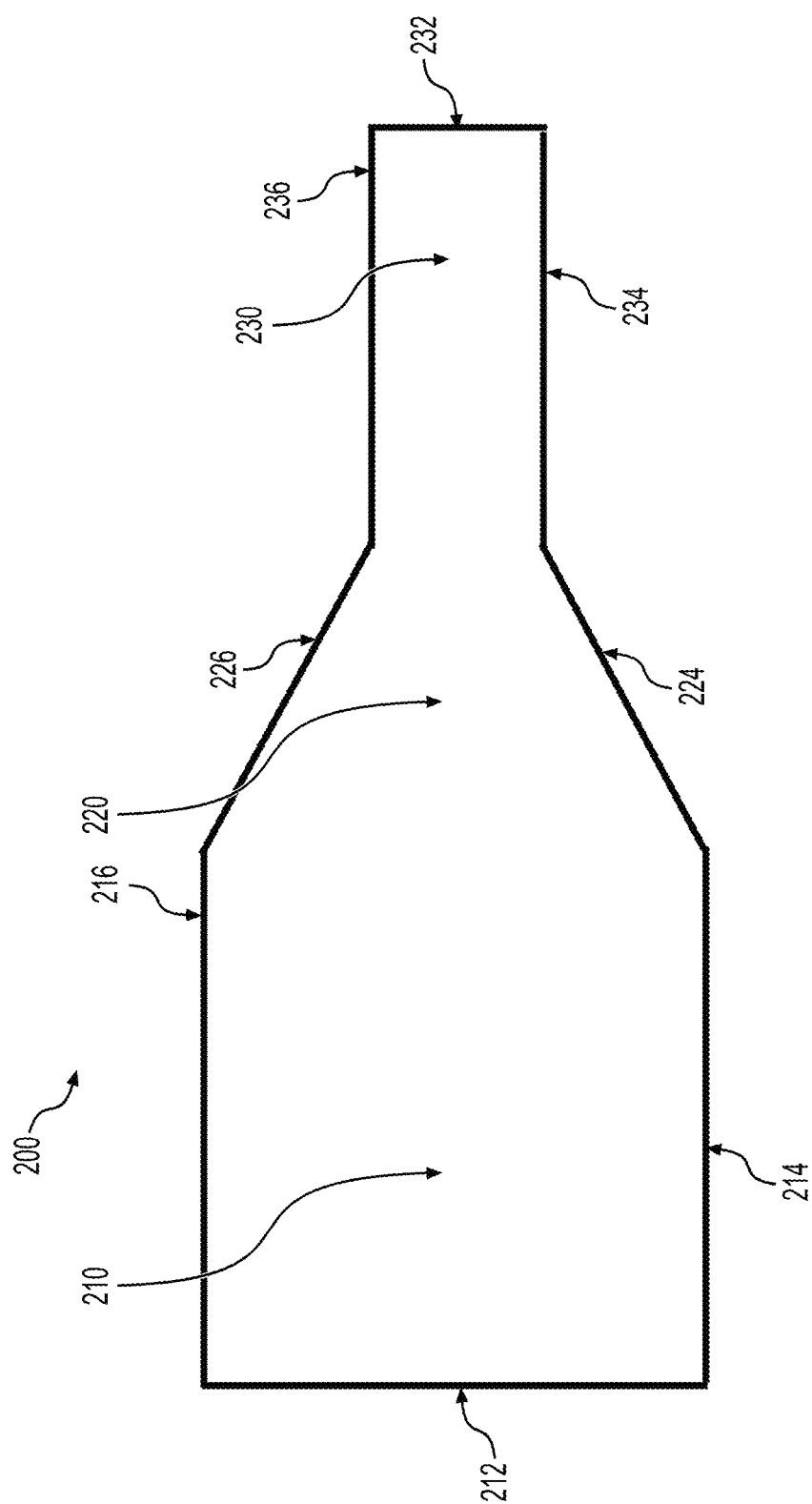
FIG. 4 is a right side elevation view of a rack mounting feature of the left mounting panel of FIG. 3.

As shown in FIG. 4, in this embodiment, each aperture 200 extends from a front end 212 to a rear end 232. The aperture 200 has an enlarged portion 210, a reduced portion 230 and a transition portion 220 extending between the enlarged and reduced portions 210, 230. The enlarged portion 210 has a first height measured between a lower end 214 and an upper end 216, while the reduced portion 230 has a second height measured between a lower end 234 and an upper end 236. As can be seen, the second height of the reduced portion 230 is less than the first height of the enlarged portion 210. A height of the transition portion 220, measured between a lower end 224 and an upper end 226, decreases along a span thereof in the depth direction of the rack 10 (i.e., from the front to the rear of the aperture 200) from the enlarged portion 210 to the reduced portion 230.

Figure 5:
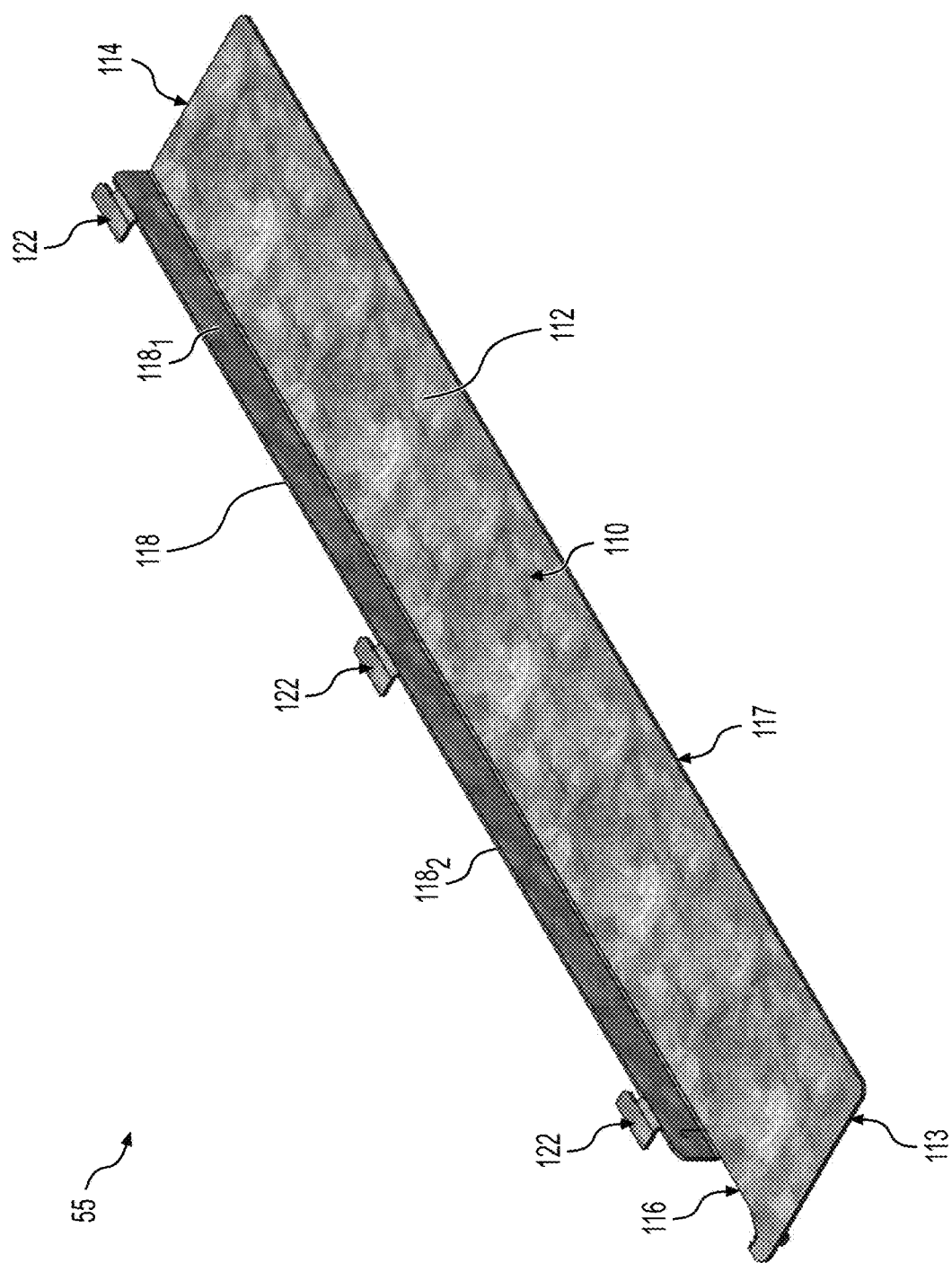
FIG. 5 is a perspective view, taken from a top, front, right side, of a left mounting bracket of an electronic equipment module configured to be connected to the left mounting panel of FIG. 3.

In this embodiment, the support unit 55 of each electronic equipment module 15 includes left and a right mounting brackets 110 configured to be connected to the left and right mounting panels 27 respectively. The mounting brackets 110 will now be described with reference to FIG. 5 which depicts the left mounting bracket 110 of the support unit 55. The right mounting bracket 110 of the support unit 55 is a mirror image of the left mounting bracket 110 and therefore will not be described in detail herein. It is to be understood that the same description applies to the right mounting bracket 110, albeit with a mirrored configuration.

The left mounting bracket 110 has a horizontally-extending portion 112 extending from a front end 113 to a rear end 114 between left and right lateral ends 116, 117. As can be seen, the left mounting bracket 110 extends in the depth direction such that, in use, the front end 113 is located proximate the front end 211 of the mounting panel 27 while the rear end 114 is located proximate the rear end 220 of the mounting panel 27. The left mounting bracket 110 also has a vertically-extending portion 118 extending from the left lateral end 116 of the horizontally-extending portion 117 at a right angle and defining an internal side surface $118_1$ and an external side surface $118_2$. In this embodiment, the mounting bracket 110 has three connector legs 122 extending from the vertically-extending portion 118. Each of the connector legs 122 is configured to engage with a respective rack mounting feature 200 of the corresponding mounting panel 27 to connect the mounting bracket 110 to the rack 10. In this embodiment, the connector legs 122 extend laterally from a top end 119 of the vertically-extending portion 118 and at a right angle from the vertically-extending portion 118.

The three connector legs 122 of the mounting bracket 110 are configured to engage three vertically aligned rack mounting features 200 of the corresponding mounting panels 27 (i.e., a corresponding rack mounting feature 200 of each column $202_A$, $202_B$, $202_C$). In particular, the connector legs 122 of the mounting bracket 110 may be inserted in the enlarged portions 210 of the rack mounting features 200 and then slid into the reduced portions 230 of the corresponding rack mounting features 200. In use, the electronic equipment of a given electronic equipment module 15 is disposed on the horizontally extending portions 112 of the corresponding left and a right mounting brackets 110.

Optionally, in alternative embodiments, the left and right mounting brackets may be formed as single integral component, notably as a same metal sheet that is bent into shape to have its left and right lateral sides identical to the left and right mounting brackets 110 described above.

Figure 6:
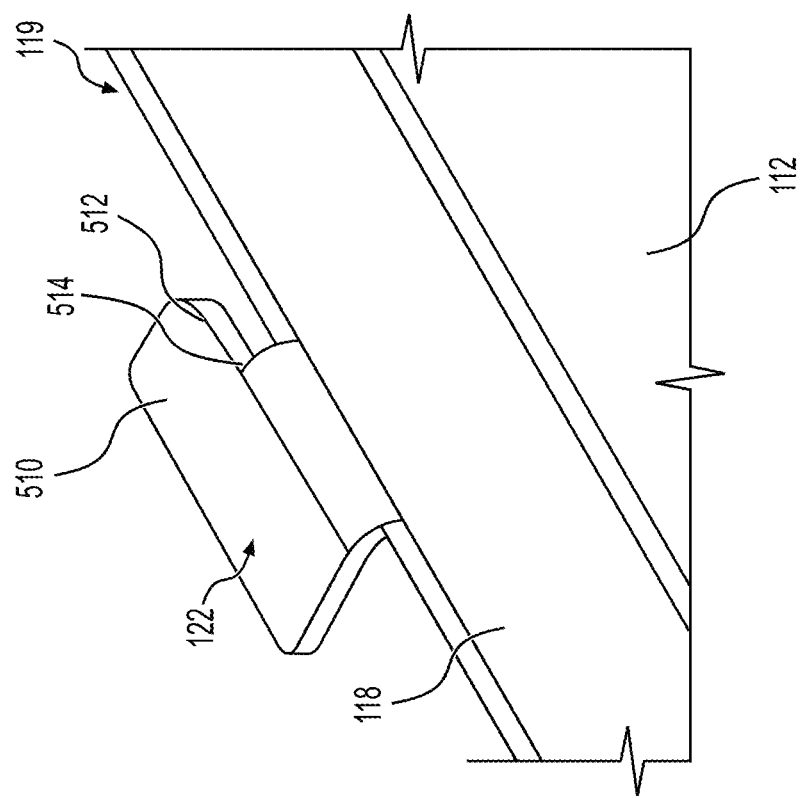
FIG. 6 is a perspective view of a connector leg of the left mounting bracket of FIG. 5.

An exemplary one of the connector legs 122 will now be described with reference to FIG. 6. In this embodiment, all of the connector legs 122 are identical and therefore it is to be understood that the same description applies to all of the connector legs 122 of the left and right mounting brackets 110.

In this embodiment, the connector leg 122 has a hook portion 510 extending rearwardly to allow the connector leg 122 to be hooked onto a corresponding one of the rack mounting features 200 as will be described below. The hook portion 510 is spaced from the external side surface $118_2$ such that an interlocking gap is defined between the external side surface $118_2$ and the hook portion 510. In particular, the interlocking gap is defined by the external side surface $118_2$ and by edges 512, 514 of the connector leg 122, which extend at a right angle to one another. The edge 512 is laterally spaced from the external side surface $118_2$ and extends substantially parallel thereto.

In order to engage the connector legs 122 with the corresponding apertures 200 of the left mounting panel 27, in this embodiment, the connector legs 122 are inserted into the corresponding apertures 200 and slid along the apertures 200 in the depth direction of the rack 10 to hook the left and mounting brackets onto the left mounting panel 27. More specifically, for the left mounting bracket 110 for instance, each connector leg 122 is inserted in the enlarged portion 210 of the corresponding aperture 200 until the external side surface $118_2$ abuts an inner lateral surface of the mounting panel 27. The larger dimensions of the enlarged portion 210 of the apertures 200 facilitate insertion of the connector legs 122 into the apertures 200. The left mounting bracket 110 is then slid rearwardly such that each connector leg 122 slides into the reduced portion 230 of the corresponding aperture 200 until the edge 514 abuts the lateral end 232 of the aperture 200. The tapering lower and upper ends 224, 226 (FIG. 4) defining the transition portion 220 of the aperture 200 help guide the connector legs 122 into the reduced portions 230.

When sliding the connector legs 122 along the apertures 200, the left mounting bracket 110 slides along the inner lateral surface of the mounting panel 27, and the inner edge 512 of each connector leg 122 slides along an outer lateral surface of the mounting panel 27 (laterally opposed to the inner lateral surface thereof). Part of the mounting panel 27 is thus disposed in the interlocking gap defined by the mounting bracket 110. Once each connector leg 122 is positioned in the reduced portion 230 of the corresponding aperture 200, the lower end 234 and the upper end 236 of the reduced portion 230 are in contact with upper and lower surfaces 520, 530 of the connector leg 122 respectively. Therefore, the connector legs 422 can no longer be moved rearwardly, vertically or laterally.

Returning to FIG. 3, in this embodiment, the mounting panel 27 also has a plurality of rack mounting features 270 for mounting another type of electronic equipment module to the rack 10. Notably, the rack mounting features 270 are different from the rack mounting features 200 described above. As such, the rack mounting features 200 can be referred to as first rack mounting features 200 and the rack mounting features 270 can be referred to as second rack mounting features 270. The rack mounting features 270 are distributed in two distinct columns $272_A$, $272_B$ that are spaced from one another in the depth direction of the rack 10. Each second rack mounting feature 270 of the front column $272_A$ is horizontally aligned with a corresponding rack mounting feature 270 of the rear column $272_B$, thereby defining sets of two rack mounting features 270 on a same row. Moreover, in this embodiment, the columns $272_A$, $272_B$ of second rack mounting features 270 are offset from the columns $202_A$, $202_B$, $202_C$ of the first rack mounting features 200 in the depth direction. In particular, the column $272_A$ is disposed between the columns $202_A$, $202_B$ while the column $272_B$ is disposed between the columns $202_B$, $202_C$. Furthermore, in this embodiment, the vertical distance between vertically consecutive second rack mounting features 270 is greater than the vertical distance between vertically consecutive first rack mounting features 200. For example, the vertical distance between vertically consecutive second rack mounting features 270 may be double or more than double the vertical distance between vertically consecutive first rack mounting features 200. The mounting panel 27 may comprise additional rows and/or columns of second rack mounting features 270 in other embodiments. In this embodiment, the second rack mounting features 270 are apertures that have a different shape than the apertures 200. Notably, the apertures 270 are provided to connect other electronic equipment modules that have the same module width MW1 as the electronic equipment modules 15 but conforming to a different mounting standard and/or having a different height in rack units. For instance, the apertures 270 may be used to connect electronic equipment modules that have another type of connectors legs and/or electronic equipment modules having a greater height than the first electronic equipment modules 15.

The mounting panel 27 also defines fastener openings 225 distributed over the mounting panel 27 through which fasteners (e.g., bolts) may be inserted to connect the mounting panel 27 to one of the vertical walls 24 of the rack 10.

Since the right mounting panel 27 of a given housing section 25 is a mirror image of the left mounting panel 27, the rack mounting features 200 of the left mounting panel 27 of the given housing section 25 are horizontally aligned with corresponding rack mounting features 200 of the right mounting panel 27 of the given housing section 25 such that, in use, a given one of the electronic equipment modules 15 may be mounted within the housing section 25 between the left and right mounting panels 27 using the two sets of rack mounting features 200.

Figure 13:
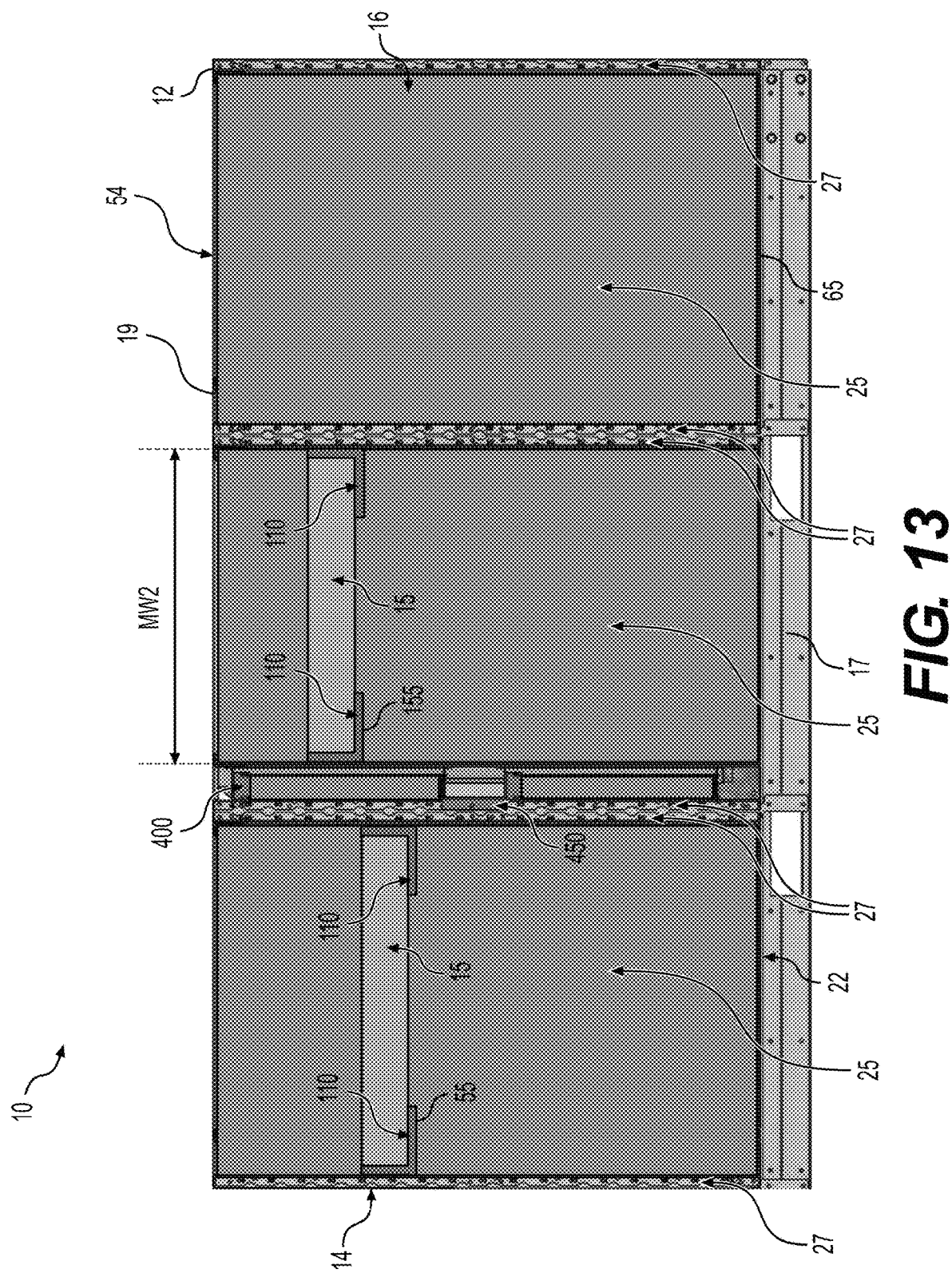
FIG. 13 is a front elevation view of the rack equipped with the rack adapting device of FIG. 7, and shown equipped with another exemplary electronic equipment module.

As mentioned above, a rack adapting device 400 is provided to adapt the rack 10 to house electronic equipment modules that are different from the first electronic equipment modules 15. More particularly, as shown in FIG. 13, the rack adapting device 400 can be used to adapt the rack 10 to house second electronic equipment modules 115. Each second electronic equipment module 115 includes a support unit 155 and electronic equipment such as a server or other electronic equipment (e.g., networking equipment) supported by the support unit 155. The support unit 155 provides connecting means for connecting the electronic equipment module 115 to the rack 10. Notably, in this embodiment, each support unit 155 includes left and right mounting brackets 110, similarly to the support units 55 described above. However, the left and right mounting brackets 110 of each support unit 155 are spaced apart from one another, when connected between the rack adapting device 400 and the rack 10, such that the second electronic equipment modules 115 have a standardized second module width MW2 that is less than the first module width MW1. To that end, the rack adapting device 400 is connectable to the mounting panels 27 to modify the housing sections 25 to define an adapted housing width that is suitable for connection of the second electronic equipment modules 115. Notably, the adapted housing width corresponds to the second module width MW2. In this embodiment, the second module width MW2 is 19 inches.

The rack adapting device 400 will now be described in greater detail with reference to FIGS. 7 to 12. In this embodiment, the various components of the rack adapting device 400 described above are sheet metal components. Nevertheless, it is contemplated that one or more of these components could be made differently in other embodiments.

In this embodiment, the rack adapting device 400 includes an adapter body 410 having a width dimensioned such that, when the rack adapting device 400 is connected to one of the left and right mounting panels 27 defining a given housing section 25, said housing section 25 has an adapted housing width corresponding to the second module width MW2 along a vertical span of the rack adapting device 400. In this embodiment, the rack adapting device 400 is configured to be connected to the left mounting panel 27 of any of the housing sections 25. In other embodiments, a mirrored version of the rack adapting device 400 could be connected to the right mounting panel 27 of the given housing section 25 instead of the left mounting panel 27.

In this embodiment, the adapter body 410 includes a vertically-extending portion 430 and upper and lower frame members 405 connected to the vertically-extending portion 430. The vertically-extending portion 430 is a panel that, in use, extends parallel to the mounting panels 27 defining the given housing section 25 that the rack adapting device 400 is intended to adapt. The vertically-extending portion 430 has a front end 460 and a rear end 480 defining a length of the vertically-extending portion 430 therebetween. In this embodiment, in use, the length of the vertically-extending portion 430 spans a majority of a depth of the housing section 25 that the rack adapting device 400 is intended to adapt. Moreover, in this embodiment, in use, a height of the vertically-extending portion 430, measured between an upper end 490 and a lower end 470 thereof, spans a majority (e.g., an entirety) of the height of the housing section 25. As will be described in greater detail below, the vertically-extending portion 430 has a plurality of adapter mounting features 710 for connecting the second electronic equipment modules 115 to the adapter body 410.

Figure 7:
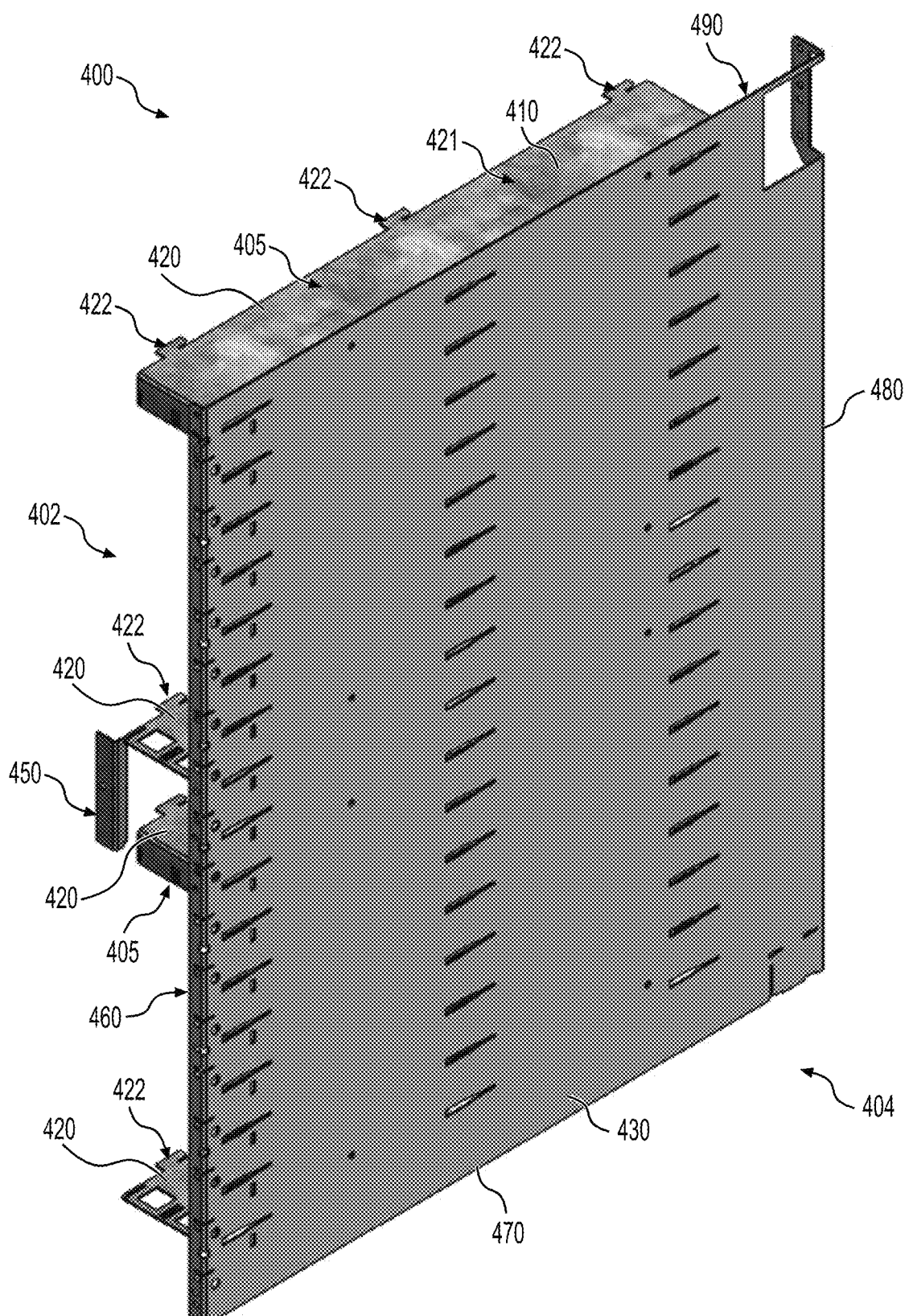
FIG. 7 is a perspective view, taken from a top, front, right side, of a rack adapting device according to an embodiment of the present technology.
Figure 8:
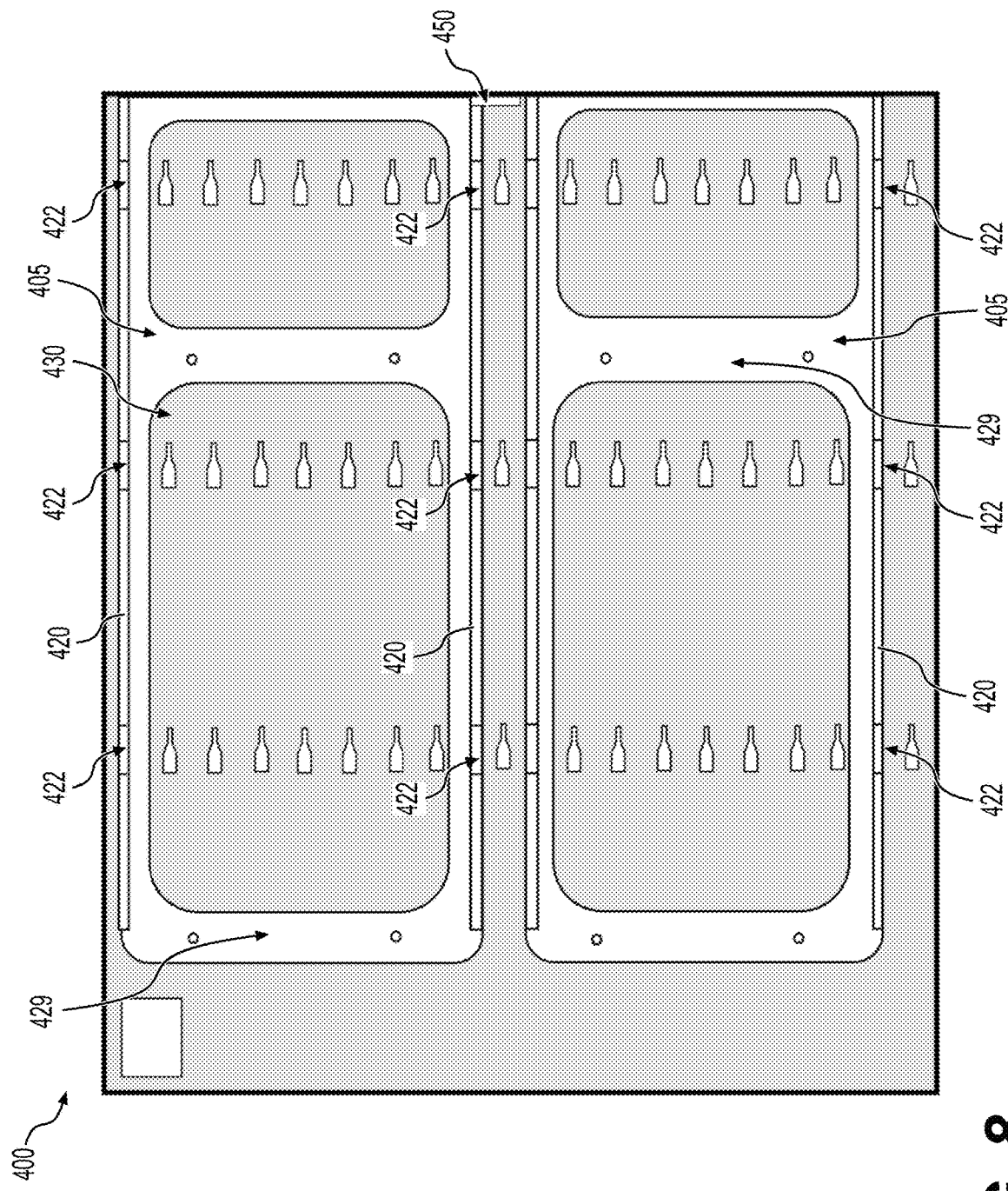
FIG. 8 is a left side elevation view of the rack adapting device of FIG. 7.
Figure 9:
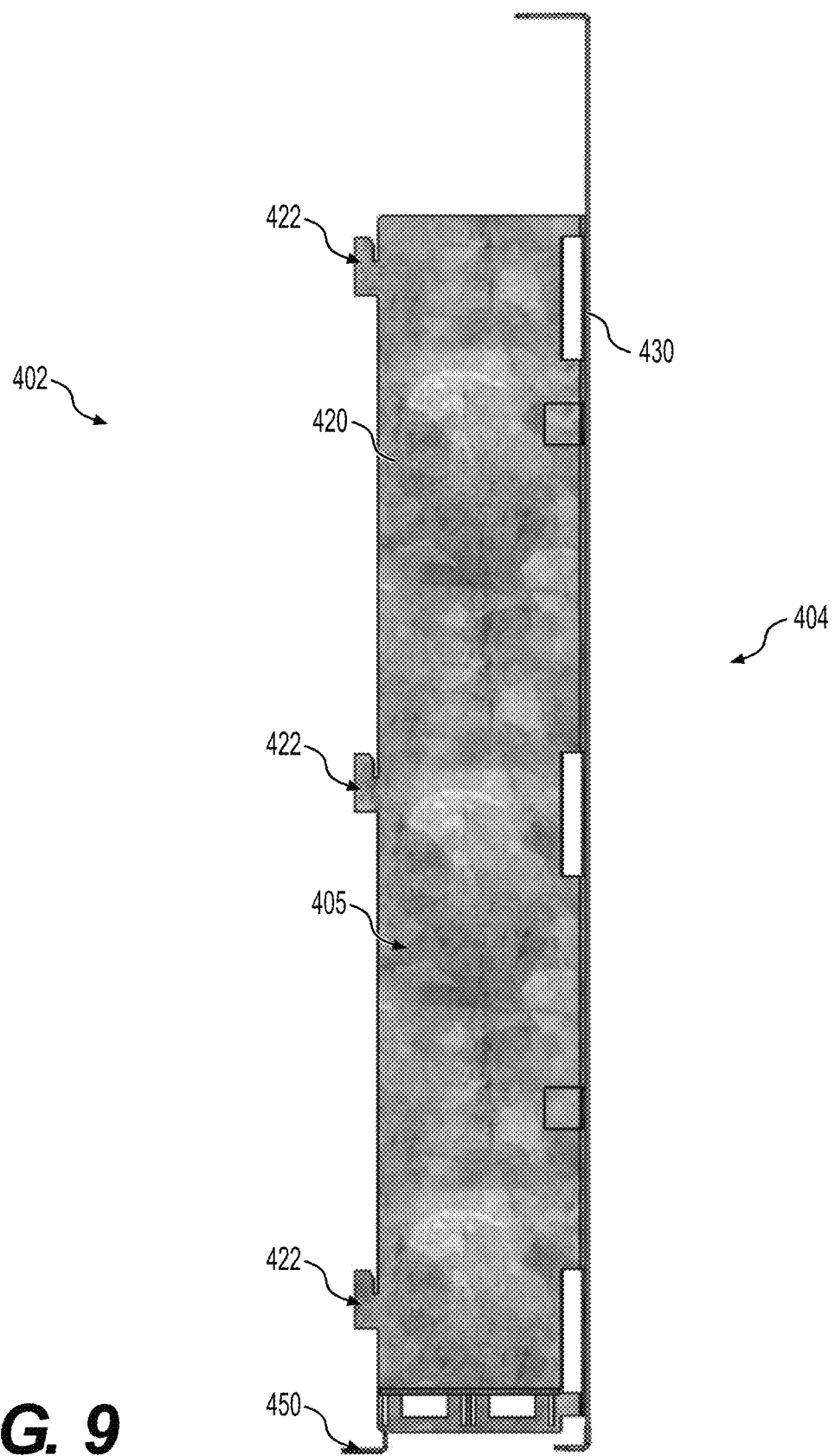
FIG. 9 is a top plan view of the rack adapting device of FIG. 7.
Figure 10:
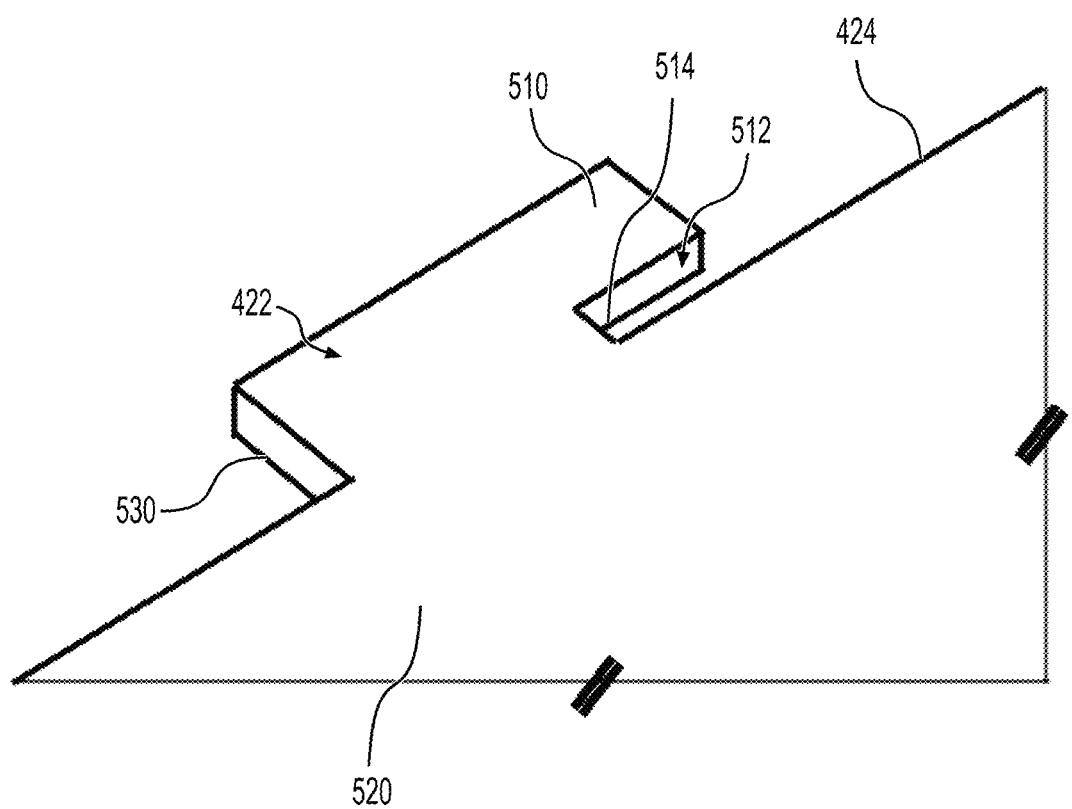
FIG. 10 is a perspective view of a rack-engaging feature of the rack adapting device of FIG. 7.

As best shown in FIG. 7, in this embodiment, each of the upper and lower frame members 405 has a vertical portion 429 and two laterally-extending portions 420 extending generally perpendicular to the vertical portion 429. Notably, the two laterally-extending portions 420 of each of the upper and lower frame members 405 extends from an upper end and a lower end of the vertical portion 429 thereof. The upper and lower frame members 405 are disposed laterally outwardly from the vertically-extending portion 430 of the adapter body 410 and are fastened (e.g., bolted or riveted) thereto. The laterally-extending portions 420 of the adapter body 410 are thus disposed on an outer lateral side 402 (i.e., a left side) of the vertically-extending portion 430, opposed to an inner lateral side 404 thereof. In this embodiment, the laterally-extending portions 420 extend along a majority of the length of the vertically-extending portion 430. The laterally-extending portions 420 are vertically spaced apart from one another. Notably, the laterally-extending portions 420 include an upper laterally-extending portion 420, a lower laterally-extending portion 420 and two middle laterally-extending portions 420. Each laterally-extending portion 420 has a main body 421 and three rack-engaging features 422 which will be described in greater detail below. In this embodiment, the main body 421 is generally planar such that each laterally-extending portion 420 extends along a respective horizontal plane. In this embodiment, the laterally-extending portions 420 extend from the vertically-extending portion 430 at a right angle. The laterally-extending portions 420 may extend from the vertically-extending portion 430 at a different angle in other embodiments.

In this embodiment, each frame member 405 is made from a single metal sheet that is cut and then bent into shape.

The laterally-extending portions 420 and the vertically-extending portion 430 can be connected to one another in various ways. In this embodiment, the vertically-extending connecting portion 429 of each pair of laterally-extending portions 420 defines one or more openings through which a fastener (e.g., a bolt) is inserted to fasten the vertically-extending connecting portion 429 to the vertically-extending portion 430 of the rack adapting device 400. Alternative ways for connecting vertically-extending connecting portion 429 to the vertically-extending portion 430 are contemplated in alternative embodiments. For instance, the connecting vertically-extending connecting portion 429 may be welded to the vertically-extending portion 430 on the outer lateral side 402 thereof.

The rack-engaging features 422 of each laterally-extending portions 420 are distributed along a length thereof such that, in use, a first one of the rack-engaging features 422 is located proximate a front end of the laterally-extending portion 420, a second one of the rack-engaging features 422 is located proximate the rear end of the laterally-extending portion 420, and a third one of the rack-engaging features 422 is generally centered between the first and second rack-engaging features 422. The three rack-engaging features 422 of each laterally-extending portion 420 are configured to engage three vertically aligned rack mounting features 200 of the corresponding mounting panel 27 (i.e., a corresponding rack mounting feature 200 of each column $202_A$, $202_B$, $202_C$). An exemplary one of the rack-engaging features 422 will now be described with reference to FIG. 10. In this embodiment, all of the rack-engaging features 422 of the laterally-extending portions 420 are identical and therefore it is to be understood that the same description applies to the other rack-engaging features 422.

In this embodiment, the rack-engaging feature 422 is a connector leg extending from the main body 421 of the laterally-extending portion 420. More specifically, the connector leg 422 extends from a left lateral end 424 of the main body 421. In this embodiment, the connector leg 422 has a hook portion 510 extending rearwardly to allow the connector leg 422 to be hooked onto a corresponding one of the rack mounting features 200 as will be described below. Notably, the hook portion 510 is spaced from the lateral end 424 such that an interlocking gap is defined between the lateral end 424 and the hook portion 510. In particular, the interlocking gap is defined by the lateral end 424 and by edges 512, 514 of the connector leg 422, which extend at a right angle to one another. The edge 512 is laterally spaced from the lateral end 424 and extends substantially parallel thereto.

In order to engage the connector legs 422 with the corresponding apertures 200 of the left mounting panel 27, in this embodiment, the connector legs 422 are inserted into the corresponding apertures 200 and slid along the apertures 200 in the depth direction of the rack 10 to hook the laterally-extending portions 420 onto the left mounting panel 27. More specifically, each connector leg 422 is inserted in the enlarged portion 210 of the corresponding aperture 200 until the lateral ends 424 of the laterally-extending portions 420 abut an inner lateral surface of the mounting panel 27. The larger dimensions of the enlarged portion 210 of the apertures 200 facilitate insertion of the connector legs 422 into the apertures 200. The adapter body 410 is then slid rearwardly such that each connector leg 422 slides into the reduced portion 230 of the corresponding aperture 200 until the edge 514 abuts the lateral end 232 of the aperture 200. The tapering lower and upper ends 224, 226 (FIG. 4) defining the transition portion 220 of the aperture 200 help guide the connector legs 422 into the reduced portions 230.

When sliding the connector legs 422 along the apertures 200, the lateral ends 424 of the laterally-extending portions 420 slide along the inner lateral surface of the mounting panel 27, and the inner edge 512 of each connector leg 422 slides along an outer lateral surface of the mounting panel 27 (laterally opposed to the inner lateral surface thereof). Once each connector leg 422 is positioned in the reduced portion 230 of the corresponding aperture 200, the lower end 234 and the upper end 236 of the reduced portion 230 are in contact with upper and lower surfaces 520, 530 of the laterally-extending portions 420 respectively. Therefore, the connector legs 422 can no longer be moved rearwardly, vertically or laterally.

Figure 11:
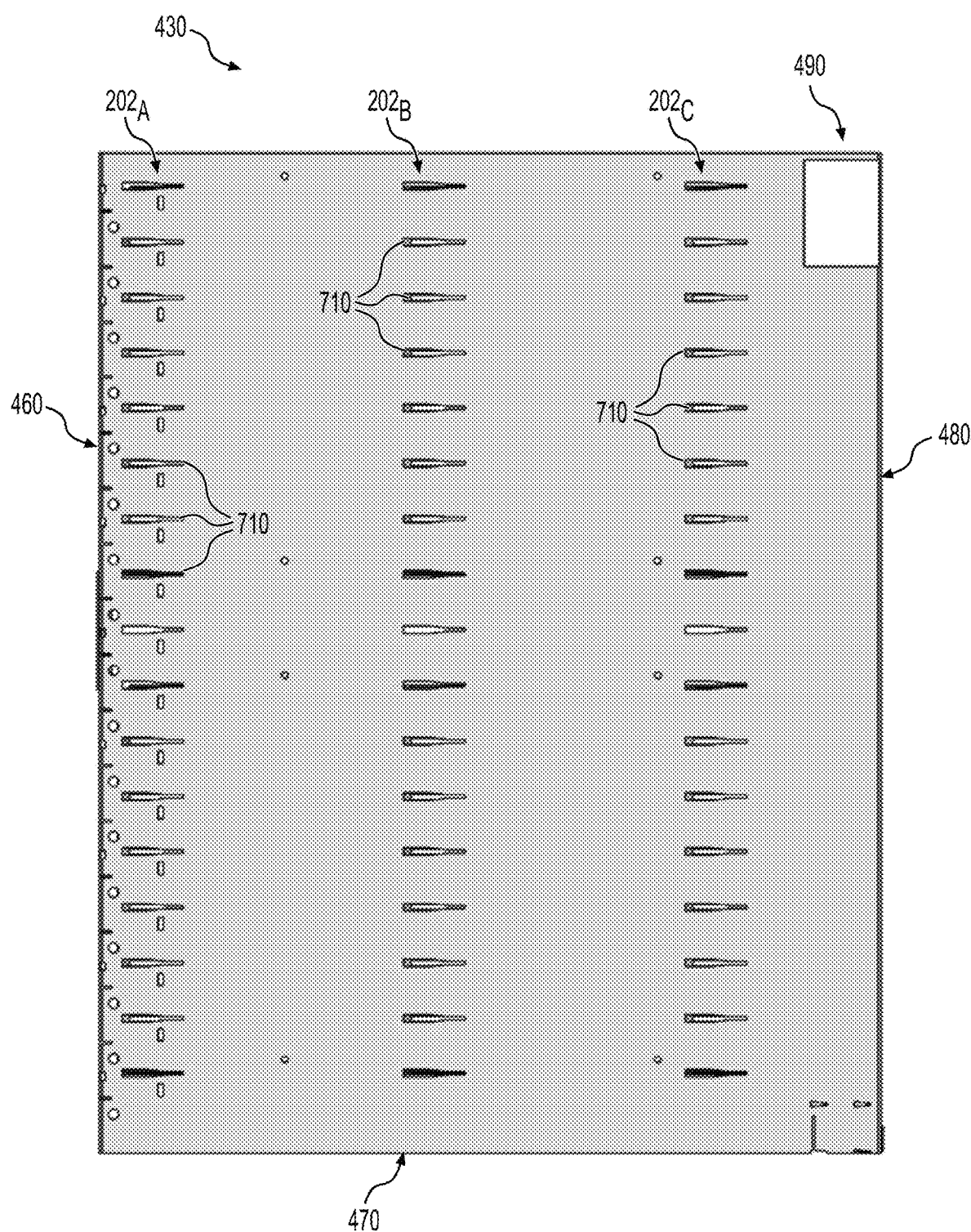
FIG. 11 is a right side elevation view of a vertically-extending portion of the rack adapting device of FIG. 7.

Turning now to FIG. 11, as mentioned above, the vertically-extending portion 430 of the adapter body 410 has adapter mounting features 710 configured for mounting the support units 155 of the second electronic equipment modules 115 to the adapter body 410 such that, in use, the second electronic equipment modules 115 are mounted between the rack adapting device 400 and, in this illustrative example, the right mounting panel 27 of the given housing section 25. In this embodiment, the adapter mounting features 710 are apertures 710 defined by the vertically-extending portion 430.

In this embodiment, the apertures 710 are distributed in three distinct columns $712_A$, $712_B$, $712_C$ that are spaced from one another in the depth direction. Each aperture 710 of the front column $712_A$ is vertically aligned with a corresponding aperture 710 of the middle column $712_B$ and with a corresponding aperture 710 of the rear column $712_C$, thereby defining sets of three apertures 710 on a same row. Notably, in this embodiment, the position of the columns $712_A$, $712_B$, $712_C$ along the depth direction of the rack 10 corresponds to the position of the columns $202_A$, $202_B$, $202_C$ of the mounting panel 27. The vertically-extending portion 430 may have additional rows and/or columns of the apertures 710 in other embodiments.

In this embodiment, the apertures 710 have a same shape as the apertures 200 of the mounting panel 27 such that it can be said that the apertures 710 are a reproduction of the apertures 200 on the inner lateral side 404 of the adapter body 410. As such, the apertures 710 will not be described in detail herein as reference can be made to the description of the apertures 200.

The left and right mounting brackets 110 of the support units 155 of the second electronic equipment modules 115 are configured to engage respective adapter mounting features 710 of the adapter body 410. More specifically, in this example, the three connector legs 122 of the left mounting bracket 110 engage three vertically aligned apertures 710 of the vertically-extending portion 430 of the rack adapting device 400, and the three connector legs 122 of the right mounting bracket 110 engage three vertically aligned apertures 200 of the right vertical panel 27 opposite the rack adapting device 400.

Figure 12:
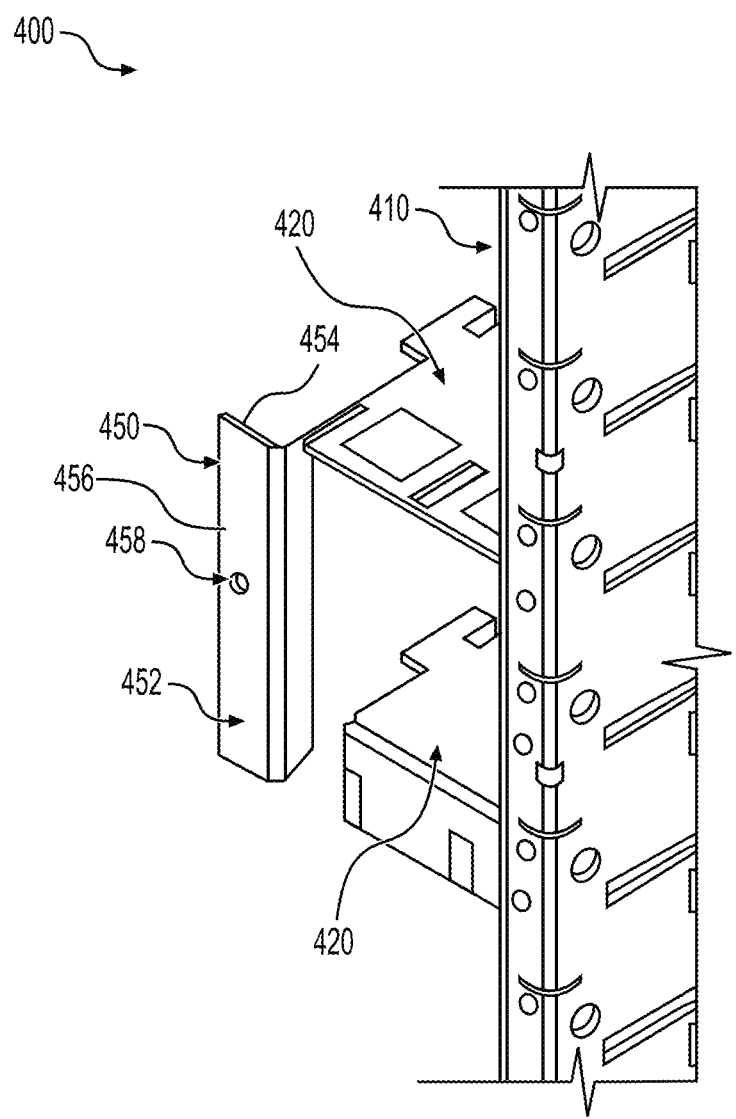
FIG. 12 is a perspective view of a locking portion of the rack adapting device of FIG. 7.

With reference to FIG. 12, in this embodiment, the adapter body 410 has a locking portion 450 that is configured to be removably fastened to the rack 10 in order to selectively secure the adapter body 410 to the rack 10. In this embodiment, the locking portion 450 is disposed on a front side of the adapter body 410 and is connected to one of the laterally-extending portions 420. In particular, the locking portion 450 is connected to one of the middle laterally-extending portions 420 of the adapter body 410. In this embodiment, the locking portion 450 is an integral part of one of the laterally-extending portions 420, namely being a bent part of the laterally-extending portion 420 at the front end thereof. In other embodiments, the locking portion may be welded to one of the laterally-extending portions 420.

In this embodiment, the locking portion 450 has a planar wall 452 that extends generally laterally (i.e., transversally to the length of the vertically-extending portion 430). The planar wall 452 has a rear internal surface 454 and a front external surface 456 on an opposite side of the rear internal surface 454. In use, when the adapter body 410 is engaged with the corresponding mounting panel 27, the rear internal surface 454 abuts the front end 211 of the mounting panel 27 when the connector legs 422 are slid rearwardly into engagement with the apertures 200 of the mounting panel 27. The planar wall 452 defines an opening 458 through which a fastener (e.g., a bolt) is inserted to fasten the locking portion 450 to a corresponding mounting panel 27 or a corresponding vertical wall 24 of the rack 10. Additional openings 458 may be provided in some embodiments. The front end 211 of the mounting panel 27 defines a corresponding opening configured to be aligned with the opening 458 such that the locking portion 450 may be fastened to the mounting panel 27. For instance, the opening at the front end 211 of the mounting panel 27 may define a thread such that the fastener may be inserted in the openings 458 and engage the threads of the opening at the front end 211 to secure the adapter body 410 to the mounting panel 27.

Figure 14:
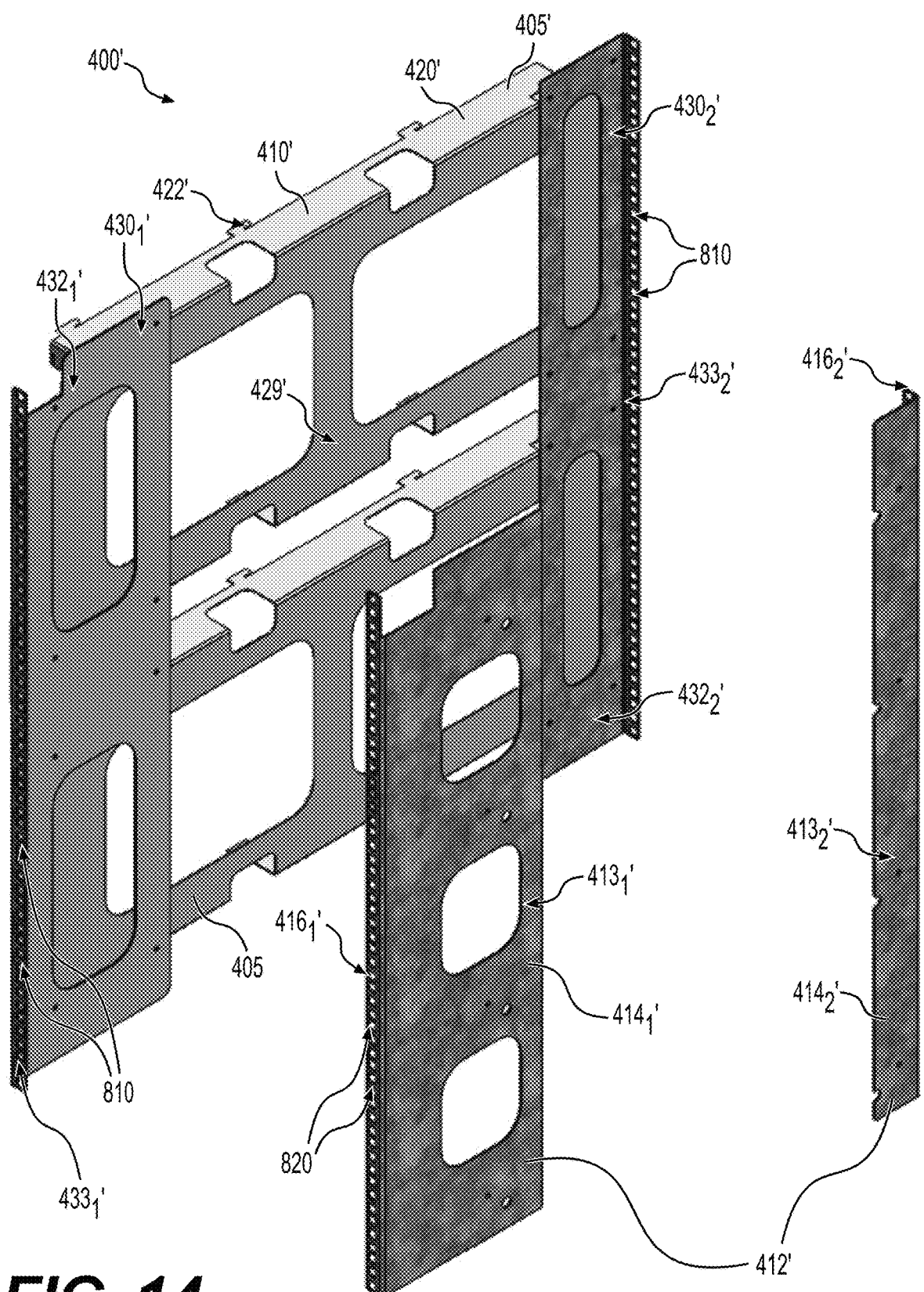
FIG. 14 is a perspective view, taken from a top, front, right side, of a rack adapting device according to another embodiment of the present technology.
Figure 15:
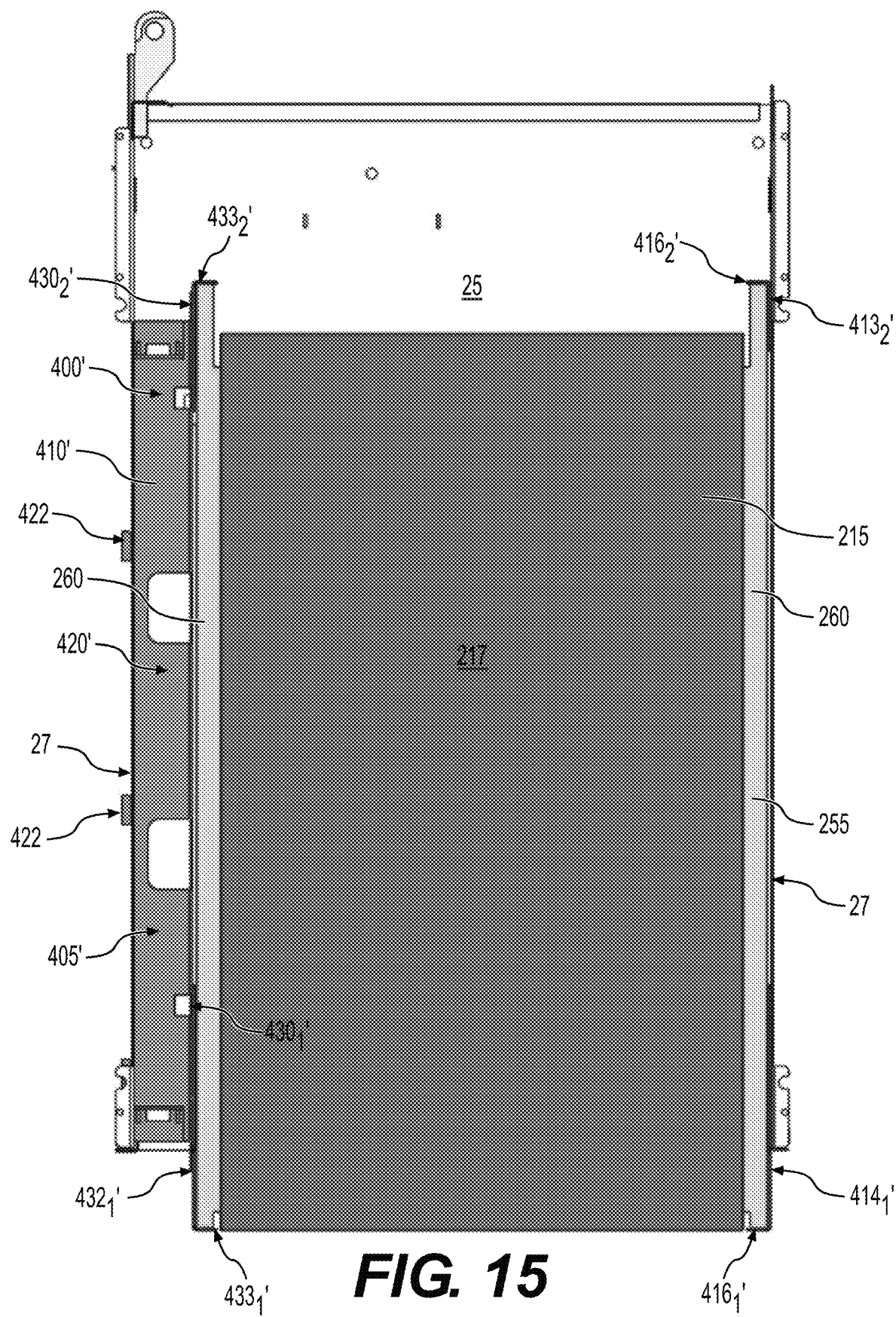
FIG. 15 is a top plan view of part of the rack equipped with the rack adapting device of FIG. 14 and another electronic equipment module.
Figure 16:
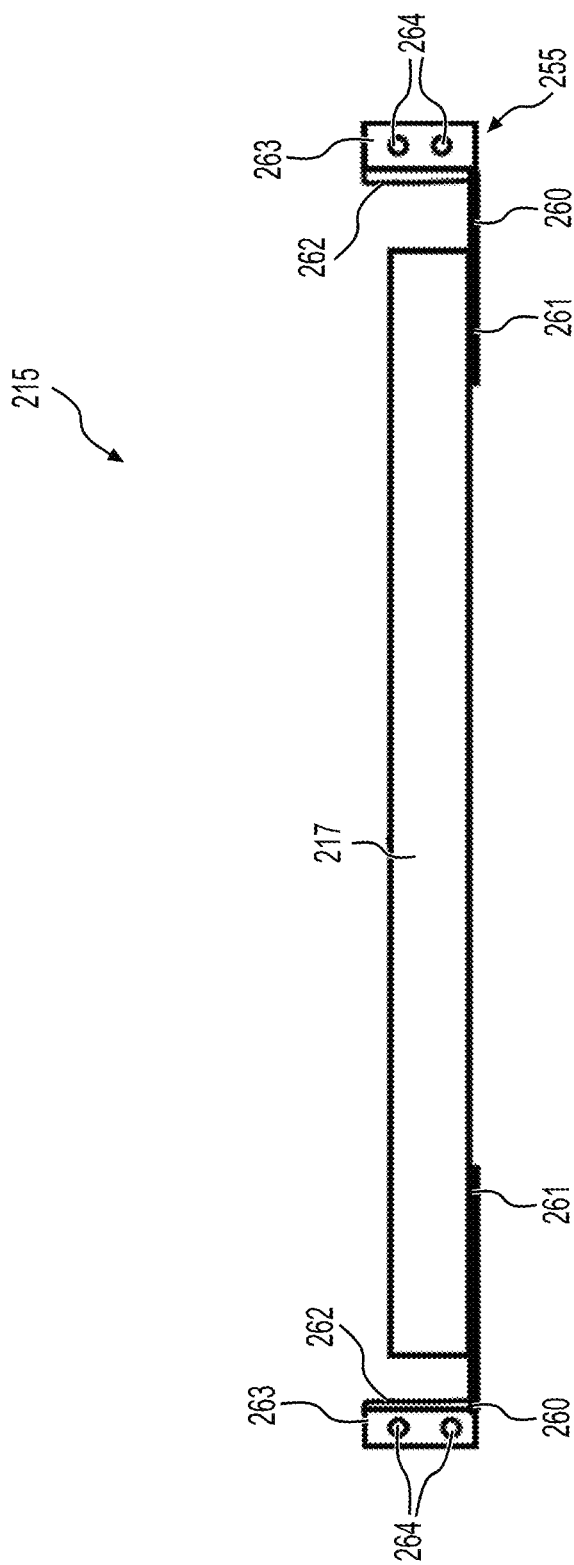
FIG. 16 is a front elevation view of the electronic equipment module of FIG. 15.

The rack adapting device 400 may be configured differently in other embodiments. For instance, as shown in FIG. 14, another rack adapting device 400' according to an alternative embodiment is configured such that the adapter mounting features thereof are different from the rack mounting features of the mounting panels 27. As such, the rack adapting device 400' could be used not only to adapt the width of a housing section 25 of the rack 10, but also to provide an alternative connection standard different from that provided by the mounting panels 27. Notably, in this alternative embodiment, as shown in FIG. 15, the rack adapting device 400' allows connecting another electronic equipment module 215 thereto. For instance, the electronic equipment module 215 is configured according to other standards, such as EIA-310-D standards. Notably, each third electronic equipment module 215 includes a support unit 255 and electronic equipment 217 such as a server or other electronic equipment supported by the support unit 255. The support unit 255 provides connecting means for connecting the electronic equipment module 215 to the rack 10. Notably, in this embodiment, as shown in FIG. 16, each support unit 255 includes left and right mounting brackets 260 laterally spaced apart from one another and configured to be connected to the left and right adapter bodies 410', 412' respectively. Each of the mounting brackets 260 has a horizontally-extending portion 261 and a vertically-extending wall 262 perpendicular thereto. In use, the electronic equipment 217 is supported by the horizontally-extending portions 261 of the mounting brackets 260. Each of the mounting brackets 260 has two front and two rear connecting flanges 263, each of which defines two threaded openings 264.

The rack adapting device 400' has a left adapter body 410' and a right adapter body 412'. The left adapter body 410' is configured to be connected to the left mounting panel 27 of a given housing section 25 of the rack 10, and the right adapter body 412 is configured to be connected to the corresponding right mounting panel 27 of the given housing section 25. It is contemplated that, in other embodiments, the left adapter body may be a mirror image of the right adapter body 412' while the right adapter body is a mirror image of the left adapter body 410' (i.e., the positions of the left and right adapter bodies 410', 412' could be reversed).

The left adapter body 410' has upper and lower frame members 405' which, in this embodiment, are vertically spaced from one another. In this embodiment, each of the upper and lower frame members 405' are substantially similar to the upper and lower frame members 405 described above with respect to the adapter body 410. The configuration of the frame members 405' will therefore not be described in detail herein. As the frame members 405' are substantially similar to the frame members 405 described above, similar parts have been given the same reference numerals (with the added prime character). The parts of the frame members 405' are identical to those described above in respect of the frame members 405 unless mentioned otherwise. The left adapter body 410' is connected to the mounting panel 27 by engaging the rack engaging features 422' with the rack mounting features 200 of the mounting panel 27 as previously described. In this embodiment, two consecutive laterally-extending portions 420' are connected one to another by a respective vertically-extending connecting portion 429' as previously described.

The left adapter body 410' also has front and rear vertically-extending portions $430_1'$, $430_2'$ connected to the frame members 405'. It is contemplated that, in other embodiments, the vertically-extending portions $430_1'$, $430_2'$ could be part of a single integral component. The front and rear vertically-extending portions $430_1'$, $430_2'$ have connecting bodies $432_1'$, $432_2'$ that are connected to the frame members 405'. The connecting bodies $432_1'$, $432_2'$ extend along a common vertical plane that extends in the depth direction of the rack 10 (parallel to the mounting panels 27). The front and rear vertically-extending portions $430_1'$, $430_2'$ also have respective front and rear elongated rails $433_1'$, $433_2'$ extending vertically. The front rail $433_1'$ is disposed at a front end of the front vertically-extending portion $430_1'$ and the rear rail $433_2'$ is disposed at a rear end of the rear vertically-extending portion $430_2'$. The front and rear rails $433_1'$, $433_2'$ are perpendicular to the connecting bodies $432_1'$, $432_2'$ such that a front surface of each of the rails $433_1'$, $433_2'$ extends along a plane normal to the plane along which the connecting bodies $432_1'$, $432_2'$ extend. In this embodiment, the front and rear rails $433_1'$, $433_2'$ extend along a height of the vertically-extending portions $430_1'$, $430_2'$. Each of the front and rear rails $433_1'$, $433_2'$ defines a plurality of adapter mounting features 810 for connecting electronic equipment modules 215 thereto. Notably, in this embodiment, the adapter mounting features 810 are apertures defined by the rails $433_1'$, $433_2'$. In particular, in this embodiment each rail $433_1'$, $433_2'$ defines multiple apertures 810 aligned in a single column. As will be described below, the apertures 810 are configured to receive a fastener therein that engages the electronic equipment module 215 to secure the electronic equipment module 215 to the adapter body 410'.

The right adapter body 412' has a front vertically-extending portion $413_1'$ and a rear vertically-extending portion $413_2'$. It is contemplated that, in other embodiments, the front and rear vertically-extending portions $413_1'$, $413_2'$ could be a single integral component. The front and rear vertically-extending portions $413_1'$, $413_2'$ have respective connecting bodies $414_1'$, $414_2'$ that are planar and extend parallel to the corresponding right mounting panel 27 (i.e., parallel to the connecting bodies $432_1'$, $432_2'$). The connecting bodies $414_1'$, $414_2'$ define openings through which fasteners (e.g., bolts) are inserted to fasten the right adapter body 412' to the right mounting panel 27 of the housing section 25.

The front and rear vertically-extending portions $413_1'$, $413_2'$ also have respective front and rear elongated rails $416_1'$, $416_2'$ extending vertically. The front rail $416_1'$ is disposed at a front end of the front vertically-extending portion $413_1'$ and the rear rail $416_2'$ is disposed at a rear end of the rear vertically-extending portion $413_2'$. The front and rear rails $416_1'$, $416_2'$ are perpendicular to the connecting bodies $414_1'$, $414_2'$ such that a front surface of each of the rails $416_1'$, $4162'$ extends along a plane normal to the plane along which the connecting bodies $414_1'$, $414_2'$ extend. In this embodiment, the front and rear rails $416_1'$, $416_2'$ extend along a height of the vertically-extending portions $413_1'$, $413_2'$. Each of the front and rear rails $416_1'$, $416_2'$ defines a plurality of adapter mounting features 820 for connecting electronic equipment modules 215 thereto. Notably, the adapter mounting features 820 are identical to the adapter mounting features 810. In particular, in this embodiment, the adapter mounting features 820 are apertures defined by the rails $416_1'$, $416_2'$, each rail $433_1'$, $433_2'$ defining multiple apertures 820 aligned in a single column.

In this embodiment, the apertures 810, 820 are configured to secure the electronic equipment modules 215 in the housing section 25. More specifically, the apertures 810, 820 are arranged such that the apertures 810 on the left rails $433_1'$, $433_2'$ are vertically aligned with corresponding ones of the apertures 820 on the right rails $416_1'$, $416_2'$. In this embodiment, as shown in FIG. 15, an electronic equipment module 215 is placed rearwardly of the front left and right rails 4331', 4161' to fasten the electronic equipment module 215 thereto. In particular, fasteners (e.g., bolts) are inserted through a pair of vertically consecutive apertures 810 and a corresponding pair of vertically consecutive apertures 820 aligned therewith, with the fasteners threadedly engaging the support unit 255 of the electronic equipment module 215 to fasten the electronic equipment module 215 to the front left and right rails $433_1'$, $416_1'$. Notably, each fastener is inserted into one of the apertures 810, 820 and into a corresponding opening 264 of the front connecting flange 263 of the corresponding mounting bracket 260 (FIG. 16). The same is done to secure the electronic equipment module 215 to the rear left and right rails $433_2'$, $416_2'$. As such, the mounting brackets 260 of the support unit 255 are secured to both adapter bodies 410', 412'.

As will be appreciated from the above description, the rack adapting devices 400, 400' provide a simple and effective way in which to adapt a housing section 25 of the rack 10 to accommodate electronic equipment modules 115, 215 that are narrower than the rack housing width of the rack 10. In addition, the rack adapting devices 400, 400' relatively inexpensive as they are principally made from sheet metal components connected to one another. In the case of the rack adapting device 400', it can also allow changing the connection standard of the rack 10 to accommodate electronic equipment modules 215 implementing a different connection standard than the one the rack 10 is designed to accommodate. Furthermore, as the rack 10 has three separate housing sections 25, each housing section 25 could be adapted (or not) with a rack adapting device 400, 400' such that each housing section 25 could be adapted to accommodate a different type of electronic equipment module (see for example FIG. 11 in which only the middle housing section 25 is adapted with the rack adapting device 400). Moreover, while the rack adapting devices 400, 400' have been illustrated as spanning an entirety of a height of a corresponding housing section 25, in other embodiments, the rack adapting devices 400, 400' could be made shorter such that the rack adapting devices 400, 400' only span a portion (e.g., half or a quarter) of the height of the corresponding housing section 25 such that, when the rack adapting devices 400, 400' are secured to the rack 10 in a given housing section 25, the housing section 25 can accommodate different types of electronic equipment modules along different spans of the height of the housing section 25.

Furthermore, in use, the adapter bodies 410, 410' of the rack adapting devices 400, 400' may be used to accommodate cables and/or other components associated with operation of electronic equipment modules such as fluid flow paths for cooling the electronic equipment modules. For example, cables and/or other components may be stored in a space defined between the adapter body 410, 410' and the corresponding mounting panel 27.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A rack adapting device for an electronic equipment rack, the electronic equipment rack being configured to house a plurality of first electronic equipment modules having a first module width, the electronic equipment rack comprising left and right equipment supports laterally spaced apart from one another by a rack housing width corresponding to the first module width, each of the left and right equipment supports comprising a plurality of rack mounting features for mounting the first electronic equipment modules between the left and right equipment supports, the rack mounting features being first apertures defined by the left and right equipment supports,
the rack adapting device being configured to adapt the electronic equipment rack to house a plurality of second electronic equipment modules having a second module width,
the second module width being less than the first module width,
the rack adapting device comprising:
an adapter body having a width dimensioned such that, when the rack adapting device is connected to the electronic equipment rack, the electronic equipment rack defines an adapted housing width corresponding to the second module width;
a plurality of rack-engaging features connected to the adapter body and disposed on a first lateral side thereof, the rack-engaging features being configured to engage the first apertures of one of the left and right equipment supports of the electronic equipment rack to connect the rack adapting device to the one of the left and right equipment supports; and
a plurality of adapter mounting features disposed on a second lateral side of the adapter body, the adapter mounting features being configured for mounting the second electronic equipment modules to the rack adapting device such that, in use, the second electronic equipment modules are mounted between the rack adapting device and an other one of the left and right equipment supports of the electronic equipment rack,
the adapter mounting features being second apertures defined by the adapter body, the second apertures having a same shape as the first apertures.

2. The rack adapting device of claim 1, wherein the rack-engaging features are connector legs extending from the adapter body and configured to be inserted into the first apertures of the one of the left and right equipment supports.

3. The rack adapting device of claim 2, wherein the connector legs are shaped to be inserted into the corresponding first apertures and slid along the first apertures in a depth direction of the electronic equipment rack to hook onto the one of the left and right equipment supports.

4. The rack adapting device of claim 1, wherein each second aperture comprises:
an enlarged portion having a first height;
a reduced portion having a second height, the second height being less than the first height; and
a transition portion extending between the enlarged and reduced portions, a height of the transition portion decreasing along a span thereof from the enlarged portion to the reduced portion.

5. The rack adapting device of claim 1, wherein the second apertures are distributed in a plurality of columns that are spaced from each other in a depth direction of the electronic equipment rack.

6. The rack adapting device of claim 5, wherein:
the plurality of columns is a plurality of second aperture columns;
the first apertures are distributed in a plurality of first aperture columns; and
a position of the second aperture columns along the depth direction of the electronic equipment rack corresponds to the first aperture columns.

7. The rack adapting device of claim 1, wherein the adapter body comprises a locking portion configured to abut a portion of the electronic equipment rack, the locking portion being configured to be removably fastened to the electronic equipment rack.

8. The rack adapting device of claim 1, wherein the adapter body comprises:
a plurality of laterally-extending portions vertically spaced apart from one another, the rack-engaging features being connected to the laterally-extending portions; and
a vertically-extending portion connected to the laterally-extending portions, the vertically extending portion comprising the adapter mounting features.

9. The rack adapting device of claim 1, wherein:
the adapter body is a first adapter body configured to be connected, via the rack-engaging features, to the one of the left and right equipment supports;
the adapter mounting features are first adapter mounting features; and
the rack adapting device further comprises:
a second adapter body configured to be connected to the other one of the left and right equipment supports of the electronic equipment rack; and
a plurality of second adapter mounting features provided on the second adapter body and configured for mounting the second electronic equipment modules to the rack adapting device such that, in use, the second electronic equipment modules are mounted between the first and second adapter mounting features of the first and second adapter bodies.

10. An adaptive rack system comprising:
an electronic equipment rack configured to house a plurality of first electronic equipment modules having a first module width, the electronic equipment rack comprising:
a frame;
a left equipment support and a right equipment support connected to the frame, the left and right equipment supports being laterally spaced apart from one another by a rack housing width corresponding to the first module width, each of the left and right equipment supports comprising a plurality of first apertures for mounting the first electronic equipment modules between the left and right equipment supports; and the rack adapting device of claim 1, the rack-engaging features being engageable with the first apertures of one of the left and right equipment supports to connect the adapter body thereto in order to adapt the electronic equipment rack to house a plurality of second electronic equipment modules having a second module width, the second module width being less than the first module width.

11. The adaptive rack system of claim 10, wherein:

the first apertures include a plurality of a first type of first apertures and a plurality of a second type of first apertures;

the first type of first apertures have a different shape than the second type of first apertures; and the second apertures have the same shape as the first type of first apertures.

12. The adaptive rack system of claim 11, wherein:

the first type of first apertures are arranged in a plurality of first columns; and the second type of first apertures are arranged in a plurality of second columns offset, in a depth direction of the electronic equipment rack, from the first columns.

13. The adaptive rack system of claim 10, wherein:

the adapter body is a first adapter body configured to be connected, via the rack-engaging features, to the one of the left and right equipment supports;

the adapter mounting features are first adapter mounting features; and the rack adapting device further comprises:

a second adapter body configured to be connected to the other one of the left and right equipment supports of the electronic equipment rack; and a plurality of second adapter mounting features provided on the second adapter body for mounting the second electronic equipment modules to the rack adapting device such that, in use, the second electronic equipment modules are mounted between the first and second adapter mounting features of the first and second adapter bodies.

14. The adaptive rack system of claim 10, wherein a height of the adapter body is less than a height of the one of the left and right equipment supports.

15. The adaptive rack system of claim 10, wherein:

the rack adapting device is a first rack adapting device; and the adaptive rack system further comprises:

a second rack adapting device configured to adapt the electronic equipment rack to house a plurality of third electronic equipment modules having a third module width, the third module width being less than the second module width, the second rack adapting device comprising:

an adapter body having a width dimensioned such that, when the second rack adapting device is connected to the electronic equipment rack, the electronic equipment rack defines an other adapted housing width corresponding to the third module width;

a plurality of rack-engaging features connected to the adapter body and disposed on a first lateral side thereof, the rack-engaging features being configured to engage the first apertures of one of the left and right equipment supports of the electronic equipment rack to connect the second rack adapting device to the one of the left and right equipment supports; and a plurality of adapter mounting features disposed on a second lateral side of the adapter body, the adapter mounting features being configured for mounting the second electronic equipment modules to the second rack adapting device such that, in use, the second electronic equipment modules are mounted between the second rack adapting device and an other one of the left and right equipment supports of the electronic equipment rack.

16. The adaptive rack system of claim 10, wherein the first module width is 21 inches and the second module width is 19 inches.

17. The adaptive rack system of claim 10, wherein the electronic equipment rack is a server rack.

18. An adaptive rack system comprising:

an electronic equipment rack configured to house a plurality of first electronic equipment modules having a first module width, the electronic equipment rack comprising:

a frame;

a left equipment support and a right equipment support connected to the frame, the left and right equipment supports being laterally spaced apart from one another by a rack housing width corresponding to the first module width, each of the left and right equipment supports comprising a plurality of apertures for mounting the first electronic equipment modules between the left and right equipment supports, the apertures including a plurality of a first type of apertures and a plurality of a second type of apertures, the first type of apertures having a different shape than the second type of apertures;

and a rack adapting device configured to adapt the electronic equipment rack to house a plurality of second electronic equipment modules having a second module width, the second module width being less than the first module width, the rack adapting device comprising:

an adapter body having a width dimensioned such that, when the rack adapting device is connected to the electronic equipment rack, the electronic equipment rack defines an adapted housing width corresponding to the second module width;

a plurality of rack-engaging features connected to the adapter body and disposed on a first lateral side thereof, the rack-engaging features being configured to engage the apertures of one of the left and right equipment supports of the electronic equipment rack to connect the rack adapting device to the one of the left and right equipment supports; and a plurality of adapter mounting features disposed on a second lateral side of the adapter body, the adapter mounting features being configured for mounting the second electronic equipment modules to the rack adapting device such that, in use, the second electronic equipment modules are mounted between the rack adapting device and an other one of the left and right equipment supports of the electronic equipment rack.

19. The adaptive rack system of claim 18, wherein:
the adapter mounting features are second apertures defined by the adapter body; and
the second apertures have a same shape as the first type of apertures.

20. The adaptive rack system of claim 18, wherein:
the first type of apertures are arranged in a plurality of first columns; and
the second type of apertures are arranged in a plurality of second columns offset, in a depth direction of the electronic equipment rack, from the first columns.

* * * * *